United States Patent [19]
Yamagata et al.

[11] Patent Number: 5,726,943
[45] Date of Patent: Mar. 10, 1998

[54] FAST MEMORY DEVICE ALLOWING SUPPRESSION OF PEAK VALUE OF OPERATIONAL CURRENT

[75] Inventors: Tadato Yamagata; Kazutami Arimoto, both of Hyogo, Japan

[73] Assignee: Mitsubishi Denki Kabushiki Kaisha, Tokyo, Japan

[21] Appl. No.: 583,810

[22] Filed: Jan. 5, 1996

[30] Foreign Application Priority Data

Jan. 6, 1995 [JP] Japan ................................ 7-000779
Dec. 14, 1995 [JP] Japan ................................ 7-325904

[51] Int. Cl.$^6$ .......................... G11C 7/00; G11C 7/02; G11C 8/00
[52] U.S. Cl. .................. 365/222; 365/194; 365/208; 365/230.03
[58] Field of Search ................... 365/189.11, 194, 365/205, 207, 208, 222, 230.03, 230.06

[56] References Cited

U.S. PATENT DOCUMENTS

| | | | |
|---|---|---|---|
| 4,627,033 | 12/1986 | Hyslop et al. | 365/205 |
| 4,943,960 | 7/1990 | Komatsu et al. | 365/222 |
| 5,367,493 | 11/1994 | Yamagata | 365/222 |
| 5,537,359 | 7/1996 | Toda | 365/222 |
| 5,553,028 | 9/1996 | McLaury | 365/205 |
| 5,559,748 | 9/1996 | Numata et al. | 365/222 |

*Primary Examiner*—David C. Nelms
*Assistant Examiner*—Trong Quang Phan
*Attorney, Agent, or Firm*—Lowe, Price, LeBlanc & Becker

[57] ABSTRACT

A memory cell array of a dynamic semiconductor memory device is divided into a plurality of memory cell blocks. A block selecting circuit selects and refreshes larger number of memory cell blocks in refreshing mode than the number of those selected during normal mode. Sense amplifiers in the memory cell blocks selected by the block selecting circuit are selectively driven with smaller driving force in refreshing mode than that in normal mode. More preferably the driving force is changed during the amplifying operation so as to achieve both the high sensitivity and the suppression of the peak value of the operational current.

16 Claims, 17 Drawing Sheets

5,726,943

1

FAST MEMORY DEVICE ALLOWING SUPPRESSION OF PEAK VALUE OF OPERATIONAL CURRENT

BACKGROUND OF THE INVENTION

1. Field of the Invention

The present invention relates to a dynamic semiconductor memory device in which stored information is rewritten by a refreshing operation and, more specifically, to a dynamic semiconductor memory device allowing suppression of peak value of an operational current and highly sensitive reading operation.

2. Description of the Background Art

A memory cell of a dynamic RAM (hereinafter referred to as DRAM) in adapted to store information by means of charges stored in a capacitor.

Therefore, even when charges are stored in the capacitor by the writing information once, the charges are gradually lost because of various leaks of subthreshold current or the like in an access transistor. Therefore, before the stored information is lost, refreshing operation in which data is once read and written again is necessary.

FIG. 14 shows a example of a basic structure of a conventional DRAM.

A sense amplifier 1000 is a cross coupled flip-flop circuit including a pair of N channel MOSFETs N1 and N2 and a pair of P channel MOSFETs P1 and P2.

The pair of N channel MOSFETs is grounded through an N channel MOSFET TN1 which receives at its gate a sense amplifier activating signal SA, while the pair of P channel MOSFETs is coupled to a power supply voltage Vcc through a P channel MOSFET TP1 which receives at its gate an inverted signal of the sense amplifier activating signal SA.

N channel MOSFET TN1 and P channel MOSFET TP1 constitute a sense amplifier drive circuit 1100.

To the drains of N channel MOSFETs N1 and N2 which are inputs of the sense amplifier, bit lines BL and /BL are coupled, respectively.

Bit lines BL and /BL are each coupled to a plurality of 1-transistor memory cell. However, for simplicity of drawing, only one memory cell is shown connected to each bit line. For example, a memory cell 1 coupled to bit line BL includes one capacitor C1 and an N channel access transistor T1. A specific memory cell, for example, memory cell 1, is selected by changing voltage level of a word line $WL_0$.

In the following, three operations, that is, reading, writing and refreshing of information stored in the memory cell will be described, mainly focused on current load of power supply circuit, taking memory cell 1 as an example.

First, when data is to be read from memory cell 1, by an address designating signal, not shown, external from a chip, the potential of word line $WL_0$ is set to the "H" level, transistor T1 is rendered conductive, and according to charge information stored in capacitor C1, potential on bit line BL changes. Here, bit lines BL and /BL have been precharged in advance to a potential Vcc/2 (Vcc: power supply potential), for example.

When the information stored in memory cell 1 is, for example, "0", then charges recharged in bit line BL flow to the capacitor C1 as transistor T1 turns on, and potential of bit line BL reduces by a small amount ΔV from Vcc/2 to be Vcc/2−ΔV.

Thereafter, sense amplifier activating signal SA attains to the "H" level. Since the input signal to the gate of P channel

2

MOSFET TP1 is delayed by one stage of inverter, first, N channel MOSFET TN1 changes to the on state.

As a result, the potential at a node C between sources of N channel MOSFETs N1 and N2 also changes from Vcc/2 to the ground potential. During the process of this change, the potential at node B (=potential of bit line /BL) is higher than the potential at node A (=potential of bit line BL), so that N channel MOSFET N1 which has its gate connected to node B turns on, while N channel MOSFET N2 which has its gate connected to node A turns off. As N channel MOSFET N1 turns on, the potential of bit line BL lowers to the ground potential.

Accordingly, N channel MOSFET N2 is maintained off and the potential of bit line /BL is kept at Vcc/2.

Further, by a signal obtained by inverting sense amplifier activating signal SA, P channel MOSFET T3 turns on.

Since the potential at node A has been lowered to the ground potential, P channel MOSFET P2 is on, and since the potential of node B is Vcc/2, P channel MOSFET P1 is off.

Therefore, as P channel MOSFET TP1 turns on, the potential at node B rises to the power supply potential Vcc. Meanwhile, the potential at node A is kept at the ground potential.

More specifically, by the above described operation, the potential of bit line BL attains to the ground potential, the potential of bit line /BL attains to Vcc, which means that the information stored in memory cell 1 is amplified as potential difference between bit lines BL and /BL.

In the process of the change of P channel MOSFET TP1 to the on state, current is supplied from power supply to the sense amplifiers. Here, it should be noted that though only one memory cell 1 has been described above, actually all the sense amplifiers arranged for all the columns of the memory cell array are driven. Therefore, power supply must have large current drivability. This is all the more true in memory cells integrated to a higher degree.

The foregoing will be described in greater detail with reference to FIG. 15.

FIG. 15 shows the memory cells of FIG. 14 arranged in an array.

It is assumed that the memory cell 1 of FIG. 14 belongs to the ith column of memory cell array 1004.

In the operation of reading information from memory cell 1 described with reference to FIG. 14, when transistors TP1 and TN1 in sense amplifier drive circuit 1100 turn on, not only the sense amplifier 1100 of the ith column but also the sense amplifiers of all the columns connected to the drive circuit including, for example, the sense amplifier 1002 of the jth column are driven.

Further, what is turned on when the word line $WL_0$ attains to the "H" level is not only the access transistor T1 of memory cell 1 but all the access transistors of all the columns including, for example, access transistor T3 in memory cell 3 of the jth column connected to the word line. Namely, information stored in all the memory cells of the loads connected to the word line $WL_0$ is amplified by the sense amplifiers of the corresponding columns.

Therefore, the moment when sense amplifier drive circuit 1100 is driven and current is supplied to the P channel MOSFET pairs in the sense amplifiers is one of the moments when there is the largest current supply load for the power supply circuit of the DRAM.

By the above described operation, the potential difference between bit line pair BLi, /BLi of each column is amplified in accordance with the information stored in the memory cell, and thereafter, in order to externally read the information of a desired memory cell, potential of a column selection line 1102 attains to the "H" level, and transistors T8 and T9 turn on. As an output of sense amplifier 1000 is connected to data input/output line 1104, information of memory cell 1 is read.

At this time, current is supplied by the sense amplifier to data input/output line 1104. Therefore, at this moment also, there is a large load for the power supply circuit of the DRAM. However, current is supplied mainly for charging the data input/output line, and therefore it is not necessary to supply so large an amount of current as needed when sense amplifier drive circuit 1100 is driven.

When reading of data is completed, the potential at column selection line 1102 attains to the "L" level, and transistors T8 and T9 turn off. Sense amplifier drive circuit 1100 also turns off.

Thereafter, a bit line equalizing signal BLEQ attains to the "H" level, transistors T5, T6, T7 and so on turn on and potential of bit line pairs BLi, /BLi and so on are again precharged to the column potential $V_{BL}$ (which is normally Vcc/2) supplied from an internal power supply.

At this moment also, current load of the power supply is large. However, the potential of each bit line pair has been originally at Vcc and 0V, respectively, while the sense amplifier is driven. Therefore, the current supply at this time is not so large as that when the sense amplifier drive circuit 1100 is driven.

Writing operation is, in principle, a reversed process of reading operation and current load of power supply circuit in its operation also becomes the largest when the sense amplifier drive circuit is driven.

Refreshing operation is basically the same as the reading operation except that data is not output to the data input/output line. Therefore, there is the largest current load for the power supply circuit when the sense amplifier drive circuit is driven.

The above described current loads of the power supply circuit are depicted in FIG. 17. Referring to FIG. 17, row address strove signal /RAS controls timing of reading a row address out of selected addresses, and a column address strove signal /CAS controls timing of reading column address. The signal /WE controls whether or not write operation is to be performed.

Whether a DRAM is to be operated in the normal mode of reading or writing or in refresh mode is controlled normally by changing a manner of application of external signals. For example, three basic control signals for the DRAM, that is, signals /RAS, /CAS and /WE are applied with different timings in order to control the operation.

More specifically, when signal /RAS is set to the "L" level, thereafter signal /CAS is set to the "L" level and signal /WE is kept at the "H" level, the chip enters a read cycle (in the stand by state of the chip, /RAS=/CAS="H"). Meanwhile, when signals /RAS and /CAS are in the same state as described and the signal /WE is kept at the "L" level, the chip enters a write cycle. When signals /WE is kept at the "H" level, and the timing of setting signal /CAS to "L" is made earlier than the timing of setting signal /RAS to "L", the chip enters a refresh cycle.

The refreshing operation in this case is performed by generating an address signal utilizing an internal counter, such as disclosed in U.S. Pat. No. 4,207,618. This method is generally called /CAS before /RAS refresh, based on the method of external signal control described above.

Power supply current $I_1$ of FIG. 17 schematically shows the waveform of the power supply current in a normal cycle and a CbR (/CAS before /RAS) cycle.

Peaks $A_N$ and $A_N$ are currents mainly associated with sensing and amplifying operations, peak B is the current incidental to the operation of read/write circuit, and peak C represents a precharge current which flows as the DRAM is mainly consisting of dynamic circuit.

In FIG. 17, the timing of the signal /WE in a normal operation corresponds to a reading operation.

What consumes the largest current in the operation of the DRAM is charging/discharging current of bit lines associated with the sense amplifier operation as described above, and hence peaks $A_N$ and $A_N$ are the highest.

Meanwhile, generally, a divided operation has been employed for lowering power consumption in the DRAM, and the number of block division increases as the capacity increases. However, the larger the number of the division, the larger the number of refresh cycles (number of fresh operations necessary for refreshing all the memory cells on the chip).

Meanwhile, the absolute value of memory cell capacitor capacitance decreases as the storage capacity increases, and because of ever decreasing film thickness of capacitor dielectric film, the degradation of subthreshold characteristics of access transistors and decrease in distance between memory cells, leak current in the memory cell capacitor increases. Accordingly, the refresh characteristic of the memory cell (which corresponds to the time in which a memory cell can hold data surely without refreshing operation) tends to deteriorate.

Therefore, first, the number of refresh cycles should be reduced. The reduction in the number of refresh cycles leads to reduction in number of operations of peripheral circuits incidental to refreshing of all the memory cells. Therefore, it is also advantageous in that it results in reduced data holding current.

Secondly, as the absolute value of memory cell capacitor capacitance has been decreased, the potential difference to be detected by the sense amplifier decreases, and hence the sensitivity of the sense amplifier itself must be improved.

Therefore, in order to cope with the first problem, an approach has been taken in which operational current in a normal operation is reduced, and as means for reducing the number of refreshing cycles, larger number of blocks than in a normal operation are operated in refreshing.

FIG. 16 shows a DRAM having a structure divided into 8 blocks as an example of a prior art. Signal REF is a refresh operation control signal, which attains to "H" when the DRAM operates in the CbR timing, for example. In normal operation, the signal REF="L", and of eight blocks selected by block addresses $Z_0$ to $Z_2$, only one block operates.

By contrast, in refresh operation, the signal REF attains to REF="H", and two of the eight blocks operate. For example, if $(Z_2, Z_1, Z_0)$=(0, 0, 0) and signal REF="H", the outputs from OR circuits 118 and 122 would be "H", regardless of the value of $Z_2$, and hence blocks (0, 0, 0) and (1, 0, 0) are simultaneously selected.

However, in this method, as shown by the power supply current $I_2$ of FIG. 15, the peak value $A_{BR}$ of the current in the sense amplifier operation at the time of refreshing becomes higher than $A_N$ in a normal operation, which may possibly cause a large noise in the power supply voltage or the like.

Therefore, as the prior art has the above described structures, when at least two of the blocks in block divided DRAM are to be refreshed in a refresh operation, the following three problems should be addressed.

First, in sense amplifier drive circuit 1200 having the structure of FIG. 14, increase in the peak value of the current during sense amplifier operation at the time of refresh can not be suppressed.

Second, the peak current in normal operation cannot be suppressed. More specifically, the peak current value when the current is supplied to the p channel MOSFET pair in the sense amplifier becomes larger than the peak value of the power supply current at the moment when the current is supplied to the data input/output line or when the bit line pair is equalized.

Third, as already described, sensitivity of the sense amplifier must be increased as the capacity of the DRAM increases. This is a problem common in refreshing operation and normal operation. Further, generally, sensitivity of the sense amplifier is increased if driving force is made smaller and the speed of operation is made lower. Therefore, the problem of trade off between sensitivity and the speed of operation cannot be solved by the conventional sense amplifier drive circuit.

SUMMARY OF THE INVENTION

Briefly stated, the present invention relates to a dynamic semiconductor memory device including a memory cell array, a block selecting circuit and sense amplifiers.

The memory cell array includes a plurality of memory cells to which stored information is rewritten during refreshing operation and reading/writing of stored information is performed during normal operation, which array is divided into a plurality of blocks. The block selecting circuit selects, at the time of refreshing, larger number of blocks to be refreshed than the number of blocks selected in normal operation. The sense amplifiers are provided corresponding to a plurality of columns of the memory cells in the memory cell array, each connected to the memory cells of the corresponding column by a signal line, for amplifying information stored in the memory cell. During refreshing operation, driving force of the sense amplifier is smaller than in the normal operation.

According to another aspect of the present invention, dynamic type semiconductor memory device including a memory cell array, sense amplifiers, a switching circuit and a block selecting circuit is provided.

The memory cell array includes a plurality of memory cells to which stored information is rewritten at the time of refreshing and reading/writing of stored information is performed during normal operation, which array is divided into a plurality of paired blocks. The sense amplifiers are provided commonly corresponding to a plurality of columns of memory cells belonging to both of the paired blocks and each connected to the memory cells of the corresponding column by a signal line, for amplifying information stored in the memory cell. At the operation of the sense amplifiers, the switching circuit connects selected one of the pair of blocks of the memory cells to the sense amplifier. Block selecting circuit selects the larger number of blocks for refreshing at the time of refreshing operation than the number of blocks selected in the normal operation. The driving force of the plurality of sense amplifiers is smaller in refreshing operation than in the normal operation.

Another object of the present invention is to provide a dynamic semiconductor memory device having a sense amplifier and a sense amplifier drive circuit capable of suppressing peak current in operation without decreasing speed of operation.

Further object of the present invention is to provide a dynamic semiconductor memory device having a sense amplifier and a sense amplifier drive circuit of which sensitivity can be increased without decreasing speed of operation.

Briefly stated, the present invention relates to a dynamic semiconductor memory device including a memory cell, a sense amplifier, a first sense amplifier driving circuit and a second sense amplifier driving circuit.

To the memory cell, stored information is rewritten by refreshing operation. The sense amplifier is connected to the memory cell by means of a signal line and it amplifies stored information in the memory cell. The first sense amplifier driving circuit is controlled by a first signal, a second signal delayed by a prescribed time period from the first signal and a refresh operation control signal, and couples/decouples the sense amplifier to and from a first power supply potential. The first sense amplifier driving circuit includes a first switch circuit which is opened/closed by the first signal, and a second switch circuit which is opened/closed by the second signal and the second switching circuit has its on resistance switched to a first or a second value by refresh operation control signal. The second sense amplifier driving circuit is controlled by the same signals as the first sense amplifier driving circuit, and couples/decouples the sense amplifier to and from a second power supply potential. The second sense amplifier driving circuit includes a third switch circuit which is opened/closed by the first signal, and a first switch circuit which is opened/closed by the second signal and the second switching circuit has its on resistance switched to a third or a fourth value by the refresh operation control signal.

According to another aspect of the present invention, the dynamic semiconductor memory device includes a memory cell, a sense amplifier, a first sense amplifier driving circuit and a second sense amplifier driving circuit. To the memory, the stored information is rewritten by refreshing operation. The sense amplifier is connected to the memory cell by means of a signal line, and it amplifies stored information in the memory cell. The first sense amplifier driving circuit is controlled by a first signal, a second signal delayed by a prescribed time period from the first signal and a refresh operation control signal, and couples/decouples the sense amplifier to and from a first power supply potential. The first sense amplifier driving circuit includes a first switch circuit which is opened/closed by the first signal and having its on resistance switched to a first or a second value by the refresh operation control signal, and a second switch circuit which is opened/closed by the second signal and the second switching circuit has its on resistance switched to a third or a forth value by the refresh operation control signal. The second sense amplifier driving circuit is controlled by the same signals as the first sense amplifier driving circuit, and couples/decouples the sense amplifier to and from a second power supply potential. A second sense amplifier driving circuit includes a third switch circuit which is opened/closed by the first signal and the second switching circuit has its on resistance switched to a fifth or a sixth value by refresh operation control signal, and a fourth switch circuit which is opened/closed by the second signal and the second switching circuit has its on resistance switched to a seventh or an eighth value by the refresh operation control signal.

Therefore, an advantage of the present invention is that the sense amplifier can operate at high speed with high sensitivity, as the resistance when the sense amplifier is coupled to the first and second power supply potentials in changed in two steps with time. Further, in refreshing operation, the sense amplifier can operate with the operational current reduced, and hence peak value of the current supplied by the power supply at the time of refreshing operation can be suppressed.

Another advantage of the present invention is that larger number of blocks of memory cells which are divided into blocks are operated in refreshing operation than in a normal operation, and therefore even when the number of refreshing cycles is reduced, peak value of the power supply current at the time of refreshing operation can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

[First Embodiment]

Figure 1:
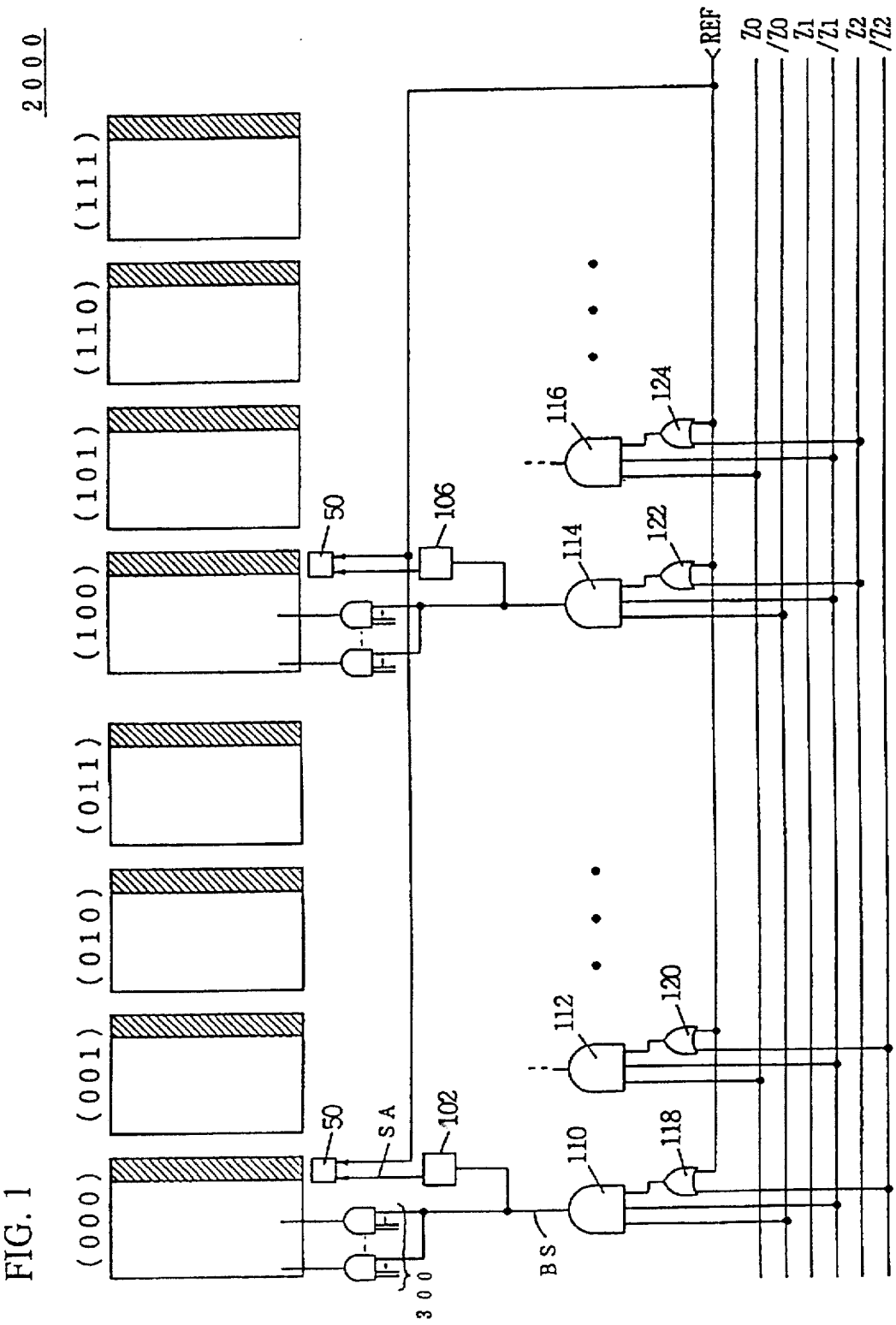
FIG. 1 is a schematic block diagram showing a structure of a semiconductor memory device in accordance with a first embodiment of the present invention.

FIG. 1 is a schematic block diagram showing a structure of a dynamic semiconductor memory device 2000 in accordance with a first embodiment of the present invention. Dynamic semiconductor memory device 2000 includes a memory cell array divided into 8 blocks (for distinction, addresses 000 to 111 are allotted); 3-input AND circuit 110 to 116 receiving as first and second inputs, two of least significant 2 bits of block address signals $Z_0$, $/Z_0$, $Z_1$ and $/Z_1$ which attain to the "H" level when a corresponding memory cell block is selected, out of block address signals $Z_0$, $/Z_0$, ... $Z_2$, $/Z_2$; OR circuits 118 to 124 receiving, as first input, one of most significant 1 bit signals $Z_2$ and $/Z_2$ of the block address signals which attains to the "H" level when the corresponding memory cell block is selected, receiving as a second input, a refresh operation control signal REF, respectively, having outputs connected to third input of corresponding AND circuits 110 to 116; a column decoder 300 receiving an output signal, that is, block selection signal BS from AND circuits 110 to 116 which attains to the "H" level when the corresponding memory cell block is selected and a column address signal, for generating a column selection signal for selecting the corresponding column of memory cells; delay circuits 102 and 106 receiving a block selection signal BS for outputting a sense amplifier activating signal SA after a prescribed time delay; and a sense amplifier drive circuit 50 receiving a sense amplifier activation signal SA and refresh operation control signal REF for driving the sense amplifiers in the corresponding memory cell block.

The operation of the dynamic semiconductor memory device 2000 shown in FIG. 1 will be briefly described.

The signal REF is a refresh operation control signal, which attains to "H" level when the DRAM operates at a CbR timing, for example.

In normal operation, the signal REF="L" level, and the corresponding memory cell block is selected by block address signals $Z_0$ to $Z_2$. More specifically, OR circuits 118 to 124 receiving the most significant bit $Z_2$ or $/Z_2$ of the block address signal output a signal of "H" level to the corresponding AND circuits 110 to 116, only when the corresponding memory cell block is selected and the signal $Z_2$ or $/Z_2$ received as the first input is at the "H" level.

Therefore, in normal operation, only one of the eight blocks selected by the block address of signals $Z_0$ to $Z_2$ operates. By contrast, in refreshing operation, the signal REF="H", and two blocks out of eight blocks operate simultaneously, regardless of the values of $Z_2$ and $/Z_2$ which are the most significant bits of block address signal. More specifically, OR circuits 118 to 124 always output a signal at the "H" level, and AND circuits 110 to 116, receiving the signal as the third input, output the block selection signal BS in accordance with the values of corresponding least significant two bits $Z_0$ and $Z_1$ of the block address signals. There are two blocks for which the block address signals are common except the most significant bit, and these two blocks are selected and operate simultaneously.

For example, if $(Z_2, Z_1, Z_0)=(0, 0, 0)$ and signal REF="H" level, the output from OR circuits 118 and 122 attain to "H" level regardless of the value of $Z_2$, and blocks (0, 0, 0) and (1, 0, 0) are simultaneously selected.

In this case, if a conventional sense amplifier drive circuit 1100 is used as the sense amplifier drive circuit 50, the current peak value $A_{BR}$ when the sense amplifier operates during refreshing becomes larger than the value $A_N$ in normal operation as described above, and there is a possibility that a large noise is applied to a power supply voltage, for example. Therefore, in the semiconductor device 2000 in accordance with the first embodiment, a sense amplifier drive circuit 50 which can suppress the current peak value during sense amplifier operation in refreshing operation is employed.

Figure 2:
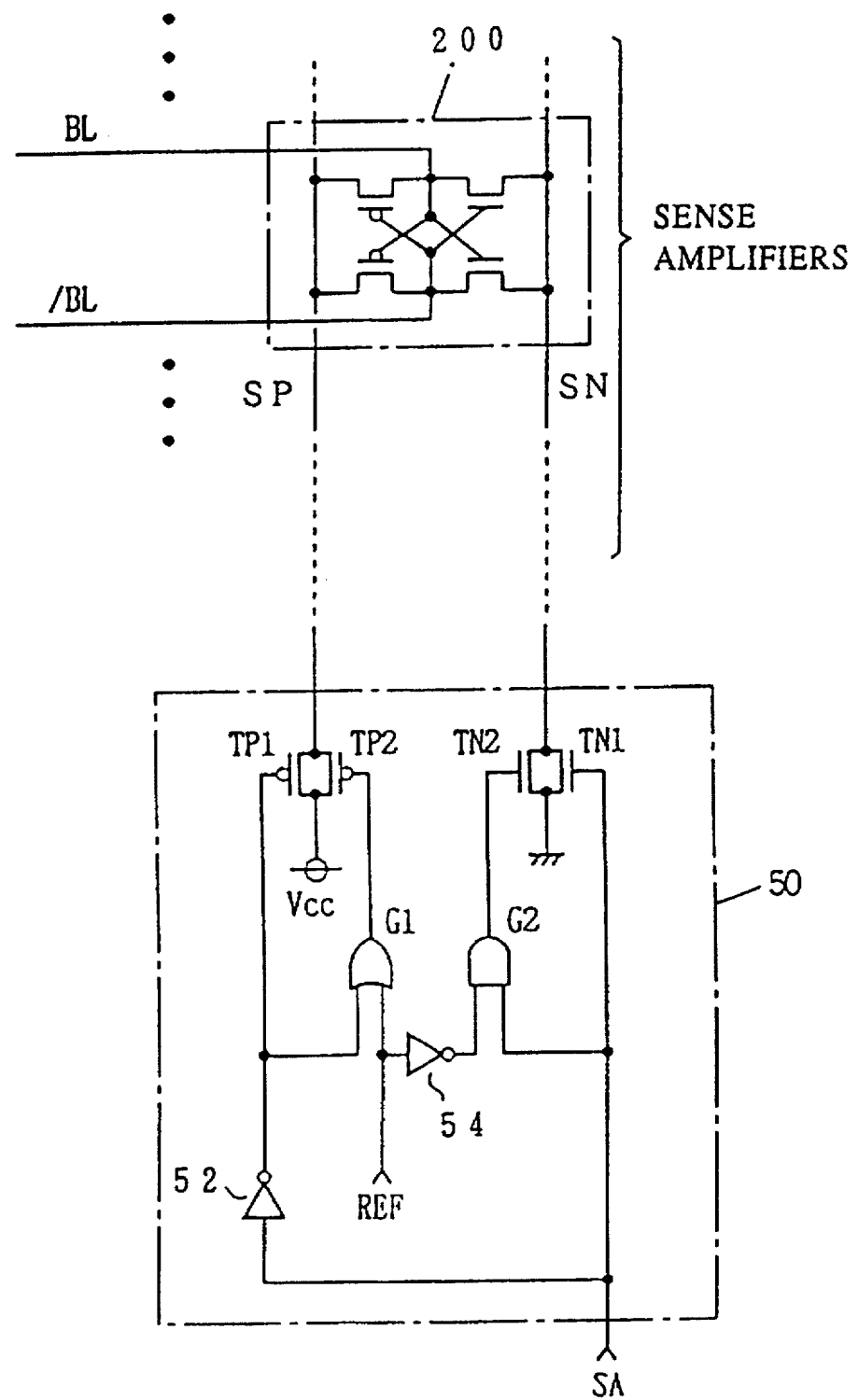
FIG. 2 is a schematic diagram showing a structures of sense amplifiers and sense amplifier drive circuit in accordance with the first embodiment.
Figure 14:
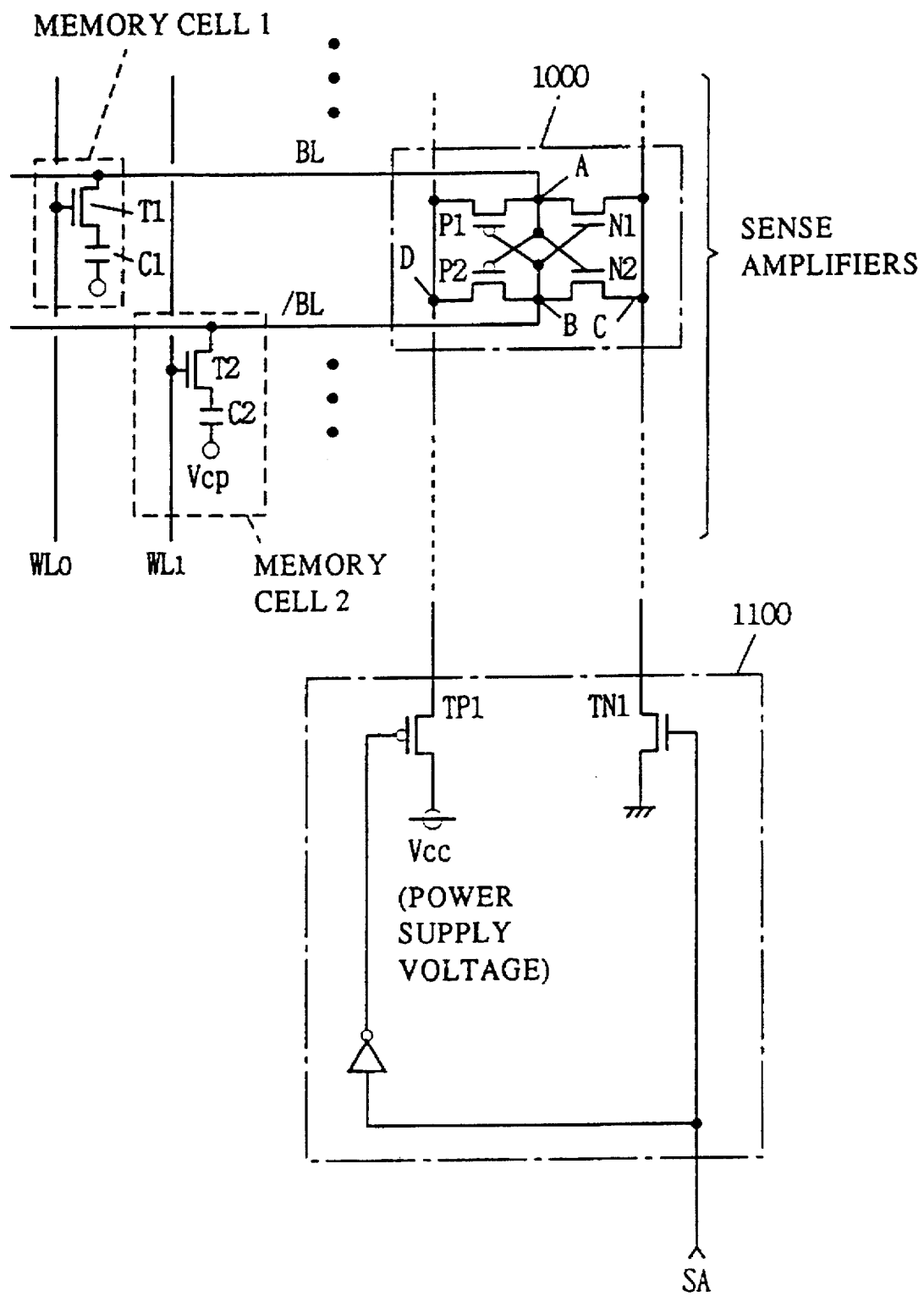
FIG. 14 is a schematic diagram showing a conventional dynamic semiconductor memory device.
Figure 15:
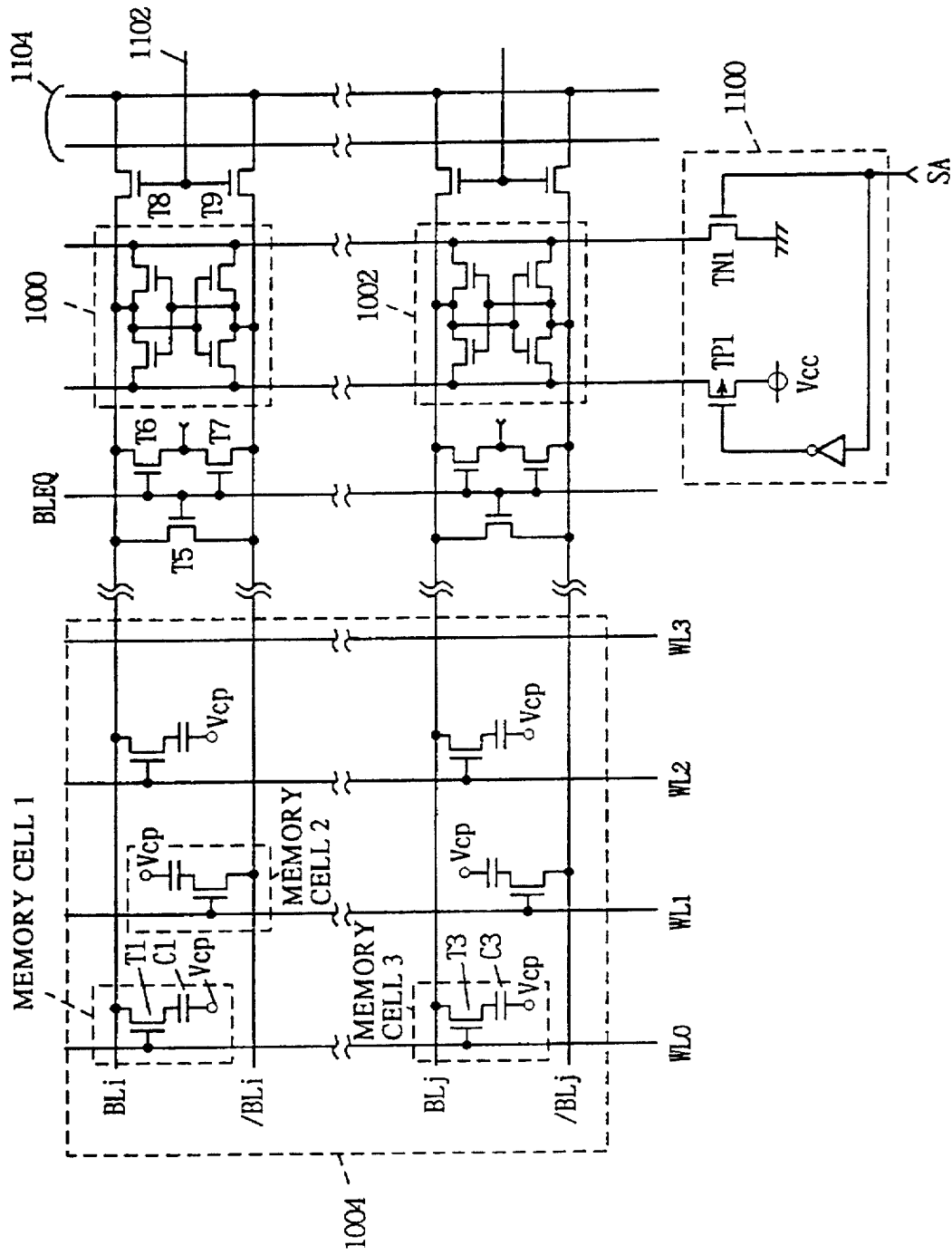
FIG. 15 is a schematic block diagram showing a memory cell array of the conventional dynamic semiconductor memory device.
Figure 16:
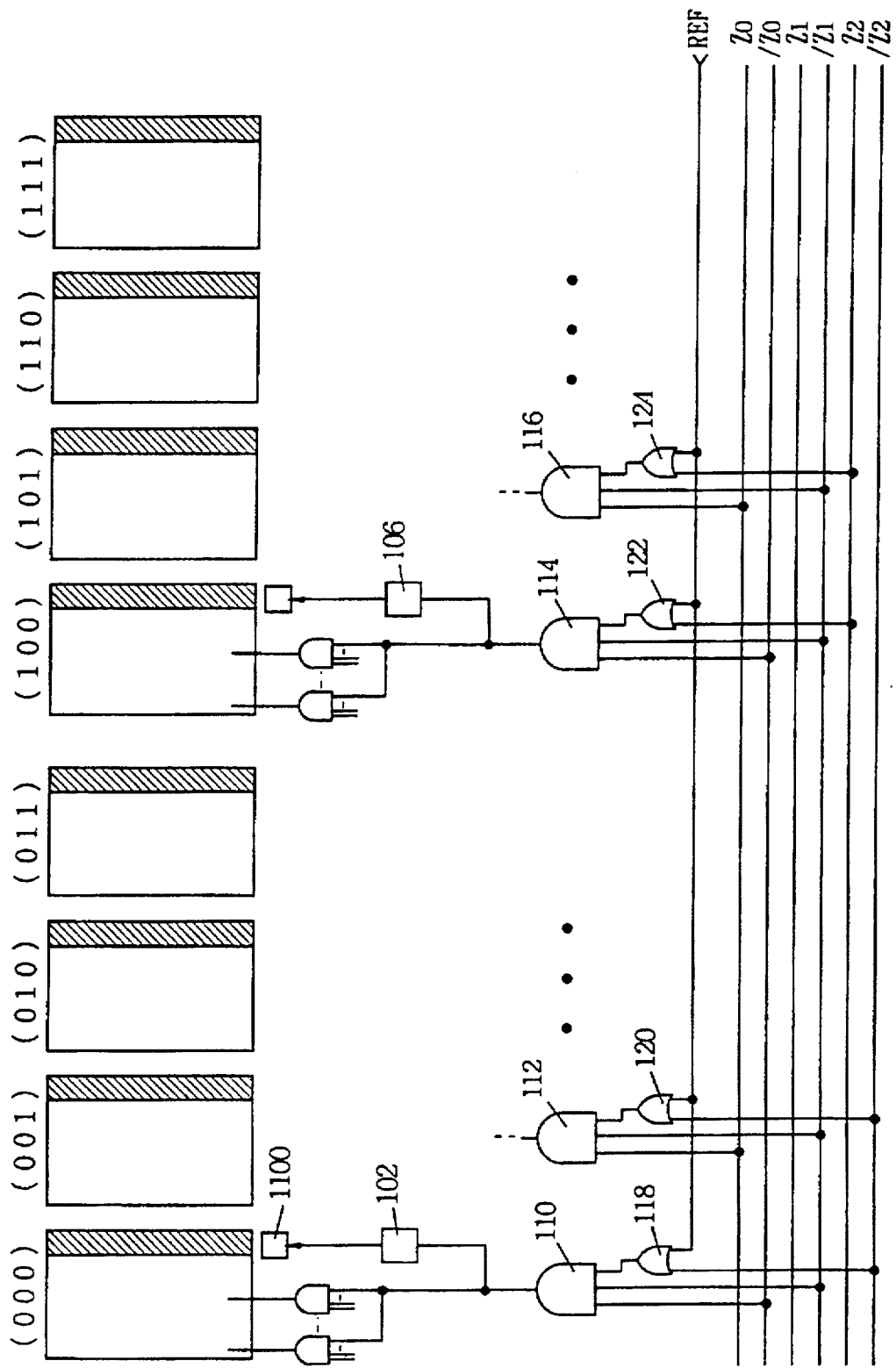
FIG. 16 is a schematic block diagram showing a conventional dynamic semiconductor memory device.
Figure 17:
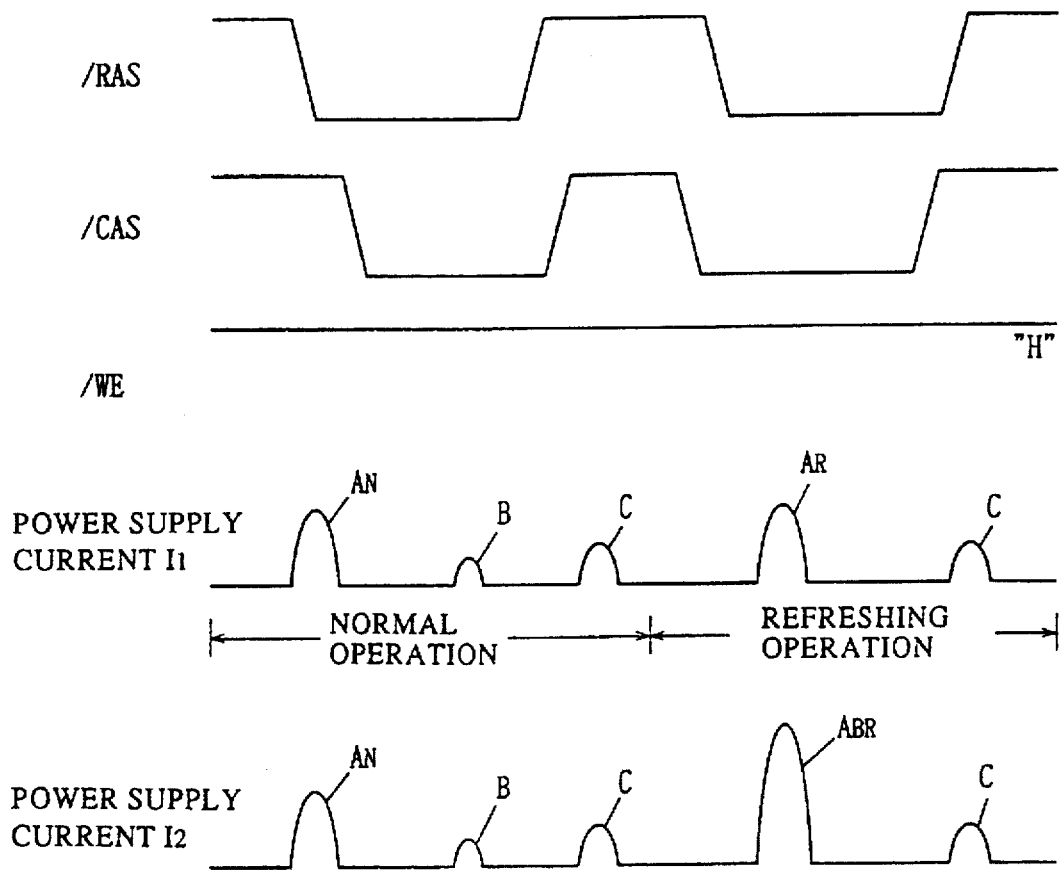
FIG. 17 is a diagram of a waveforms showing change with time of power supply current in the dynamic semiconductor memory device.

FIG. 2 is a schematic diagram showing a structure of the sense amplifier drive circuit 50 and the sense amplifiers. The circuit shown in FIG. 2 has the same structure as the prior art example shown in FIG. 14 except the sense amplifier drive circuit 50 (the memory cells are omitted from the figure).

Sense amplifier drive circuit 50 includes an N channel MOS transistor TN1 connected between ground potential supply line SN to the sense amplifier 200 and ground potential and receiving at its gate the sense amplifier activating signal SA; an inverting circuit 52 receiving a sense amplifier activating signal SA; a P channel MOS transistor TP1 connected between power supply potential supply line SP to the sense amplifier 200 and the power supply potential Vcc and receiving at its gate an output from inverting circuit 52; an inverting circuit 54 receiving as an input the refreshing operation control signal REF; an AND circuit G2 receiving the output from inverting circuit 54 and sense amplifier activating signal SA; an N channel MOS transistor TN2 connected between line SN and ground potential and receiving at its gate an output from AND circuit G2; and an OR circuit G1 receiving as inputs the output from the inverting circuit 52 and the refreshing operation control signal REF; and a P channel MOS transistor TP2 connected between line SP and power supply potential Vcc and receiving at its gate the output from OR circuit G1.

The operation will be described. In normal operation, the signal REF is at "L" and logic gates G1 and G2 are open. Therefore, an inverted signal /SA of the sense amplifier activating signal is applied to the gates of transistors TP1 and TP2, and sense amplifier activating signal SA is applied to the gates of transistors TN1 and TN2. Consequently, transistors TP1, TP2, TN1 and TN2 are all turned on, so that sufficiently large driving current flows to the sense amplifier and large driving force is obtained.

Meanwhile, at the time of CbR refresh, the signal REF attains to "H" and logic gates G1 and G2 are closed. Therefore, application of the sense amplifier activating signal and inverted signal thereof to the gate of transistors TP and TN2 are stopped, and thus these are turned off. Therefore, driving current flows only through the transistors TP1 and TN1, driving force for the sense amplifier becomes smaller, and peak current during sensing operation can be reduced.

Therefore, even when two of the blocks are selected and operated in the refreshing operation, peak current value when the sense amplifier drive circuit 50 is driven can be suppressed.

[Second Embodiment]

Figure 3:
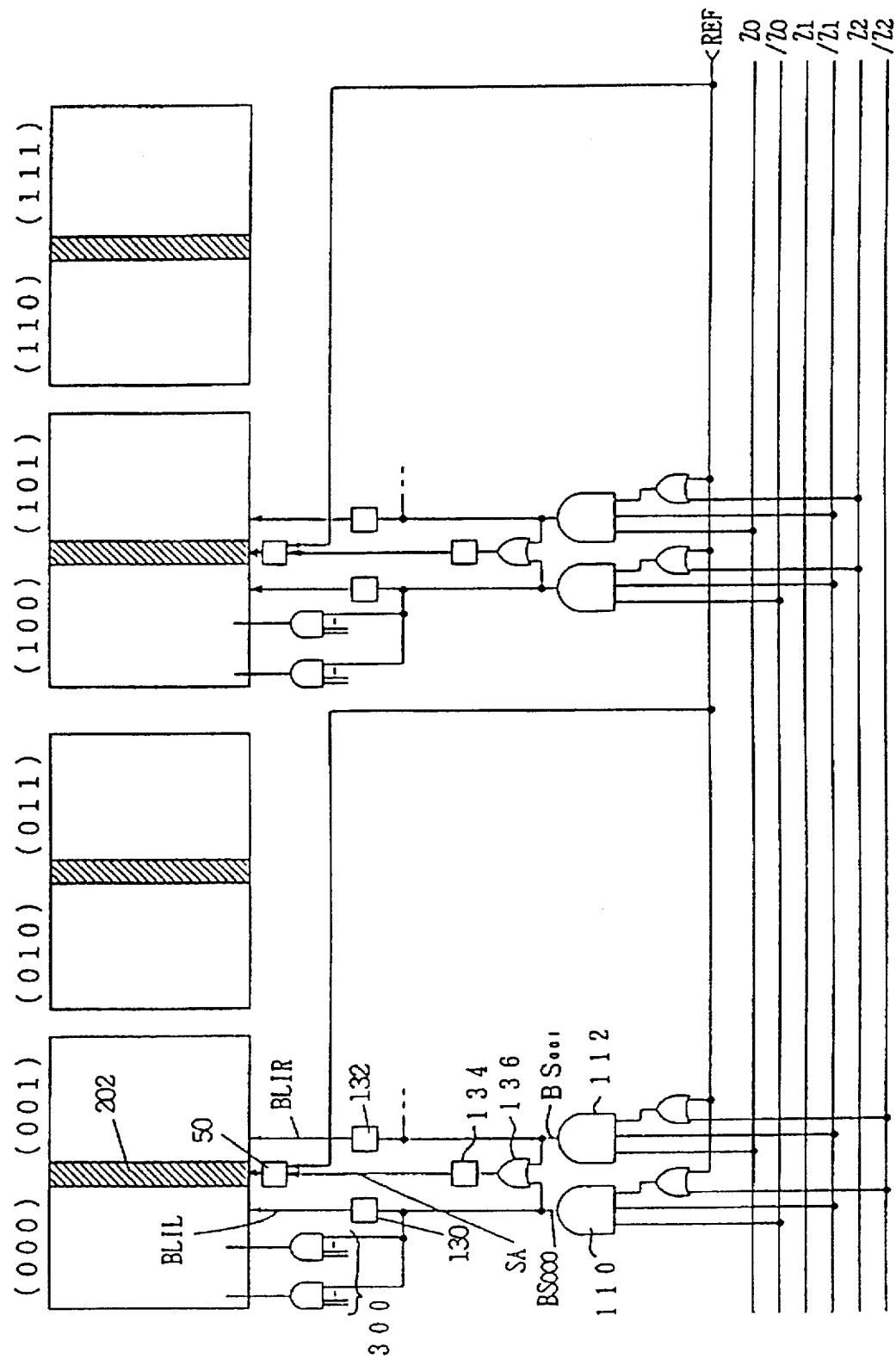
FIG. 3 is a schematic block diagram showing s structure of a semiconductor memory device in accordance with a second embodiment of the present invention.

FIG. 3 is a schematic block diagram showing a structure of a dynamic semiconductor memory device in accordance with a second embodiment of the present invention.

The structure differs from that of the dynamic semiconductor memory device in accordance with the first embodiment shown in FIG. 1 in that the memory cell array divided into eight blocks are paired two by two, and each paired memory cell blocks share sense amplifiers 202.

Accordingly, the structure for selecting each block and the structure for generating sense amplifier activating signal SA for activating sense amplifier drive circuit 50 driving the sense amplifiers 202 differ as will be described in the following.

For example, for the paired memory cell blocks (000) and (001), block selection signal and sense amplifier activating signal SA are applied in the following manner. When memory block (000) is selected, AND circuit 110 which corresponds to memory cell block (000) and receives signals corresponding to external block address signals $Z_0$ to $Z_2$ outputs an active block selection signal $BS_{000}$. Meanwhile, when memory cell block (001) is selected, AND circuit 112 which corresponds to memory cell block (001) and receiving signals corresponding to block address signals $Z_0$ to $Z_2$ outputs an active block selection signal $BS_{001}$.

Delay circuit 130 receiving block selection signal $BS_{000}$ output from AND circuit 110 outputs a left block selection signal BLIL, and delay circuit 132 receiving block selection signal $BS_{001}$ which is an output signal from AND circuit 112 outputs a right block selection signal BLIR.

In accordance with the signals BLIL and BLIR, the sense amplifiers 202 are electrically connected to the side of the corresponding memory cell block.

OR circuit 136 receiving block selecting signals $BS_{000}$ and $BS_{001}$ renders an output signal active ("H" level) when either the memory cell blocks (000) or (001) is selected, and delay circuit 134 receiving the output from OR circuit 136 outputs the sense amplifier activating signal SA. In response to the sense amplifier activating signal SA, sense amplifier drive circuit 50 starts its operation.

Figure 4:
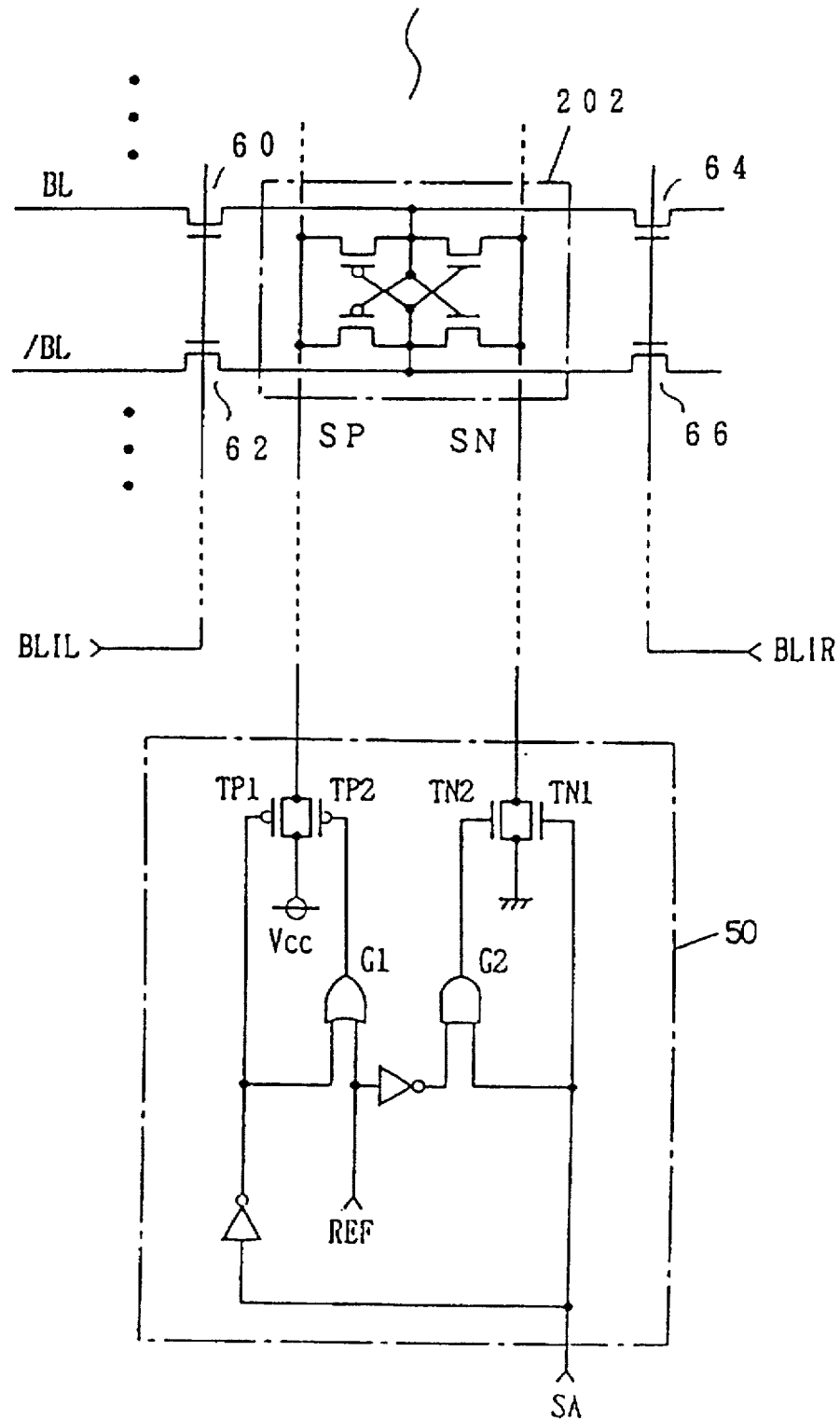
FIG. 4 is a schematic diagram showing structures of sense amplifiers and sense amplifier drive circuit in accordance with the second embodiment.

FIG. 4 is a schematic block diagram showing a structure of a sense amplifier drive circuit 50 and sense amplifiers 202 in the dynamic semiconductor memory device in accordance with the second embodiment shown in FIG. 3.

The structures are different from those of senses amplifiers 200 and sense drive circuit 50 in the first embodiment shown in FIG. 2 in that sense amplifiers 202 are connected to the bit line pairs BL and /BL belonging to the selected memory cell block by N channel MOS transistors 60 62, 64 and 66 which are opened/closed in response to the signals BLIL and BLIR.

Other corresponding portions are denoted by the same reference characters and detailed description thereof is not repeated.

By the above described structure, even in such a structure in which the memory cell arrays are divided into paired blocks and memory blocks share the same sense amplifiers in each pair, that is, even in the so called shared sense amplifier structure, the peak value of the power supply current can be suppressed during refreshing operation.

More specifically, even when two blocks are selected and operated during refreshing operation, it is possible to operate the sense amplifies with the on resistance of sense amplifier drive circuit 50 increased, and peak current value when the sense amplifier is driven can be suppressed.

[Third Embodiment]

Figure 5:
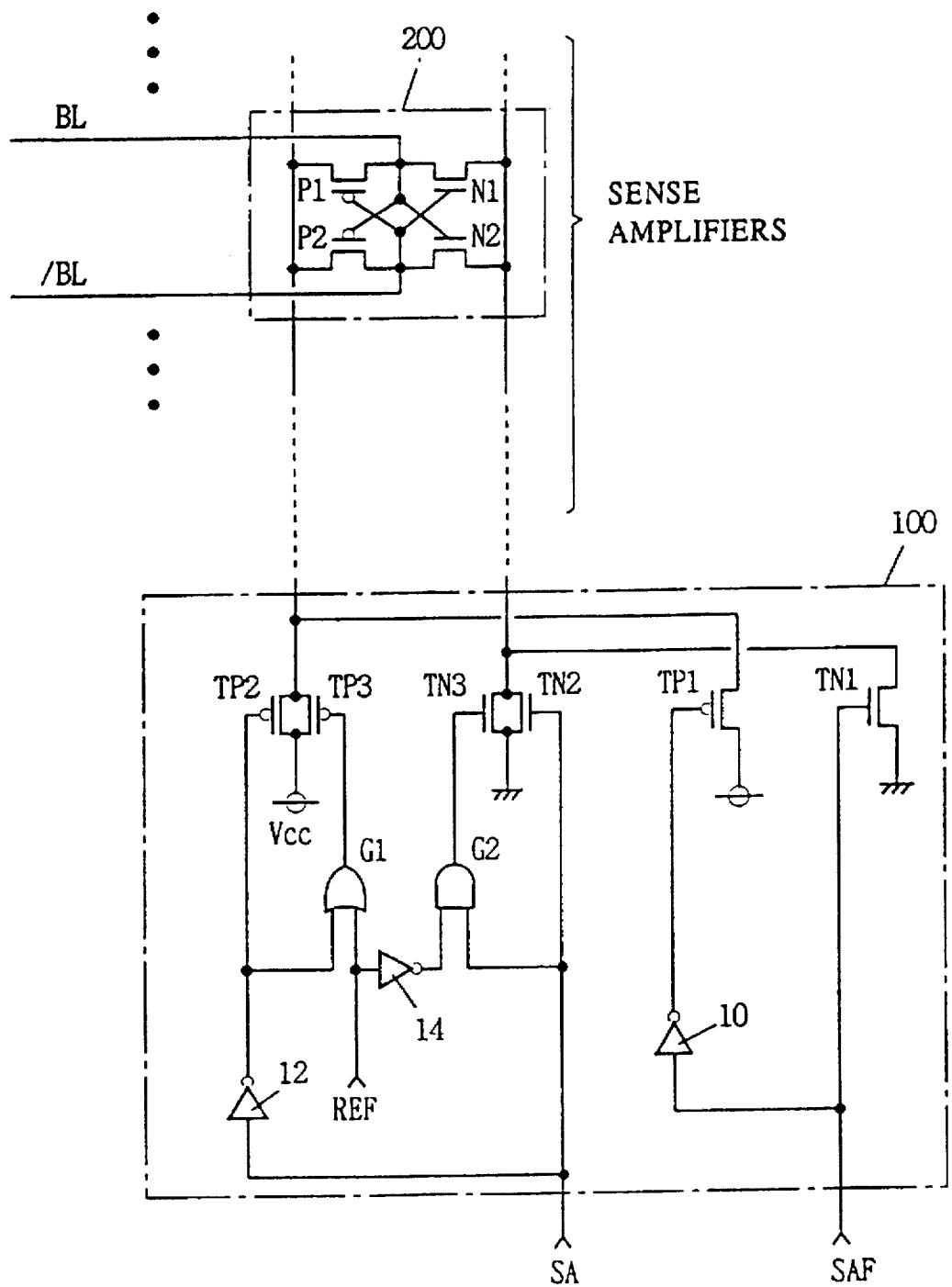
FIG. 5 is a schematic diagram showing structures of sense amplifiers and sense amplifier drive circuit in accordance with a third embodiment of the present invention.

FIG. 5 is a circuit diagram showing main portion of the third embodiment of the dynamic semiconductor memory device in accordance with the present invention showing structures of sense amplifiers 200 and sense amplifier drive circuit 100.

The structure is similar to the prior art example except the sense amplifier drive circuit 100. Sense amplifier drive circuit 100 uses, as sense amplifier activating signals, a signal SAF and a signal SA which is obtained by delaying the signal SAF.

A P channel MOSFET TP1 is rendered conductive/non-conductive delayed than N channel MOSFET TN1, as it is controlled by the signal obtained by inverting signal SAF by an inverter 10. Therefore, at the time when sense amplifier 200 starts its operation, N channel MOSFET TN1 is rendered conductive, and N channel MOSFETs N1 and N2 are driven. In other words, the sense amplifier 200 is grounded through a relatively high resistance at the start of operation.

More specifically, the gate width $W_{N1}$ of N channel MOSFET N1 and gate width $W_{N2}$ of N channel MOSFET N2 which is activated with a delay are set to satisfy the following relation:

$$W_{N2} \geq W_{N1} \quad (1)$$

Further, the gate width $W_{P1}$ of P channel MOSFET P1 and gate width $W_{P2}$ of P channel MOSFET P2 which is activated with a delay are set to satisfy the following relation:

$$W_{P2} \geq W_{P1} \quad (2)$$

Under the above described conditions, sense amplifier 200 starts its operation with the speed of operation relatively slow, as its driving force is made weak at the time of activation.

This means that the sense amplifier operates with high sensitivity, until the potential difference between bit line pair BL and /BL is amplified to the prescribed value or higher when the sense amplifier starts its operation.

This point will be described, though qualitatively, in greater detail.

For simplicity, let us consider only the portion of the N channel MOSFET in the sense amplifier structure.

As already described with reference to the prior art examples, how the potential at nodes A and B of a sense amplifier changes in accordance with the potential difference between the bit line pair BL and /BL much depends on the operation of N channel MOSFETs N1 and N2 at the start of operation. Therefore, the above consideration presents no problem.

Figure 6:
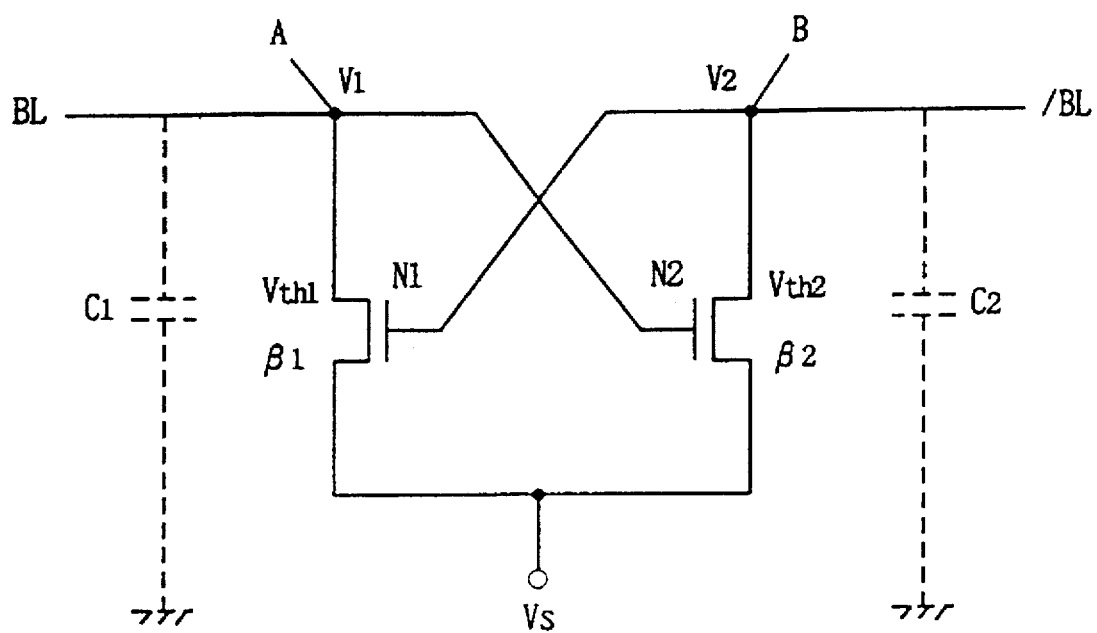
FIG. 6 is a schematic diagram illustrating the operation of the third embodiment.

FIG. 6 is a schematic circuit diagram of a sense amplifier. Referring to FIG. 6, it is assumed that threshold value, and coefficient β of N channel MOSFETs N1 and N2 are represented by $V_{th1}$, $\beta_1$ and $V_{th2}$ and $\beta_2$, respectively. Further, it is assumed that bit lines BL and /BL have stray capacitances $C_1$ and $C_2$ with respect to the ground.

Let us consider that the source potential $V_S$ of N channel MOSFET lowers from Vcc/2, which is the initial value, to the ground potential sufficiently slowly. In this case, as in the description of the operation of sense amplifier 200 of the prior art example, one of the N channel MOSFETs turns on first dependent on the potentials on bit lines BL and /BL, and the other one is kept off. As a result, the potential difference between bit lines BL and /BL is amplified.

Meanwhile, if the source potential $V_S$ lowers to the ground potential in sufficiently short time period, the potentials $V_1$ and $V_2$ at nodes A and B are approximately at the initial value even when $V_S$ attains to the ground potential, because of the stray capacitances $C_1$ and $C_2$.

Which one of N channel MOSFETs N1 and N2 turns on and which one turns off after this time point depends not only on the initial values of potentials $V_1$ and $V_2$ but also on the rate of lowering of these potentials. The rate depends both on the value β representing current drive ability of the transistor and the stray capacitance C.

Accordingly, if the rate of lowering potential varies because of variation in values β and C during manufacturing or the like, the final on/off state of transistors N1 and N2 do not always reflect the initial values if the difference in initial values of potentials $V_1$ and $V_2$ is small.

In other words, the sensitivity of the sense amplifier is degraded. Therefore, in view of the sensitivity of the sense amplifier, the speed of change of the source potential $V_S$ should preferably be slow, namely, the sources of N channel MOSFETs N1 and N2 should preferably be grounded through high resistances.

Let us return to the third embodiment of the present invention shown in FIG. 5. In the initial stage of operation, the sense amplifier 200 is coupled to the ground potential and to the power supply potential through N channel MOSFET N1 and P channel MOSFET TP1, which are rendered conductive (opened) by the signal SAF. This state corresponds to a low speed, high sensitivity operation.

Thereafter, in normal reading/writing operation, N channel MOSFETs TN2 and TN3 and P channel MOSFETs TP2 and TP3 are all opened (rendered conductive) by sense amplifier activating signal SA.

Therefore, sense amplifier 200 is coupled to the ground potential and to the power supply potential through low resistance. Namely, at this stage, it switches to a high speed, low sensitivity operation mode. Since the input potential difference has been amplified to a prescribed value at the initial stage, the lower sensitivity at this stage is not a problem.

Further, peak value of the supply current from the power supply when the sense amplifier is driven can suppressed, as the operation of the sense amplifier is step wise.

Meanwhile, in a refreshing operation, refresh operation control signal REF attains to the "H" level, the output from an OR gate G1 is always at the "H" level, and an output from an AND gate G2 is always at the "L" level.

Therefore, N channel MOSFET TN3 and P channel MOSFET TP3 are always closed (non-conductive). Therefore, what is opened (rendered conductive) by the sense amplifier activating signal SA after the initial low speed, high sensitivity operation mode is only the N channel MOSFET TN2 and P channel MOSFET TP2, the sense amplifier operates with the driving force smaller than in the normal operation, and hence peak value of the current supplied from the power supply circuit is suppressed.

[Fourth Embodiment]

Figure 7:
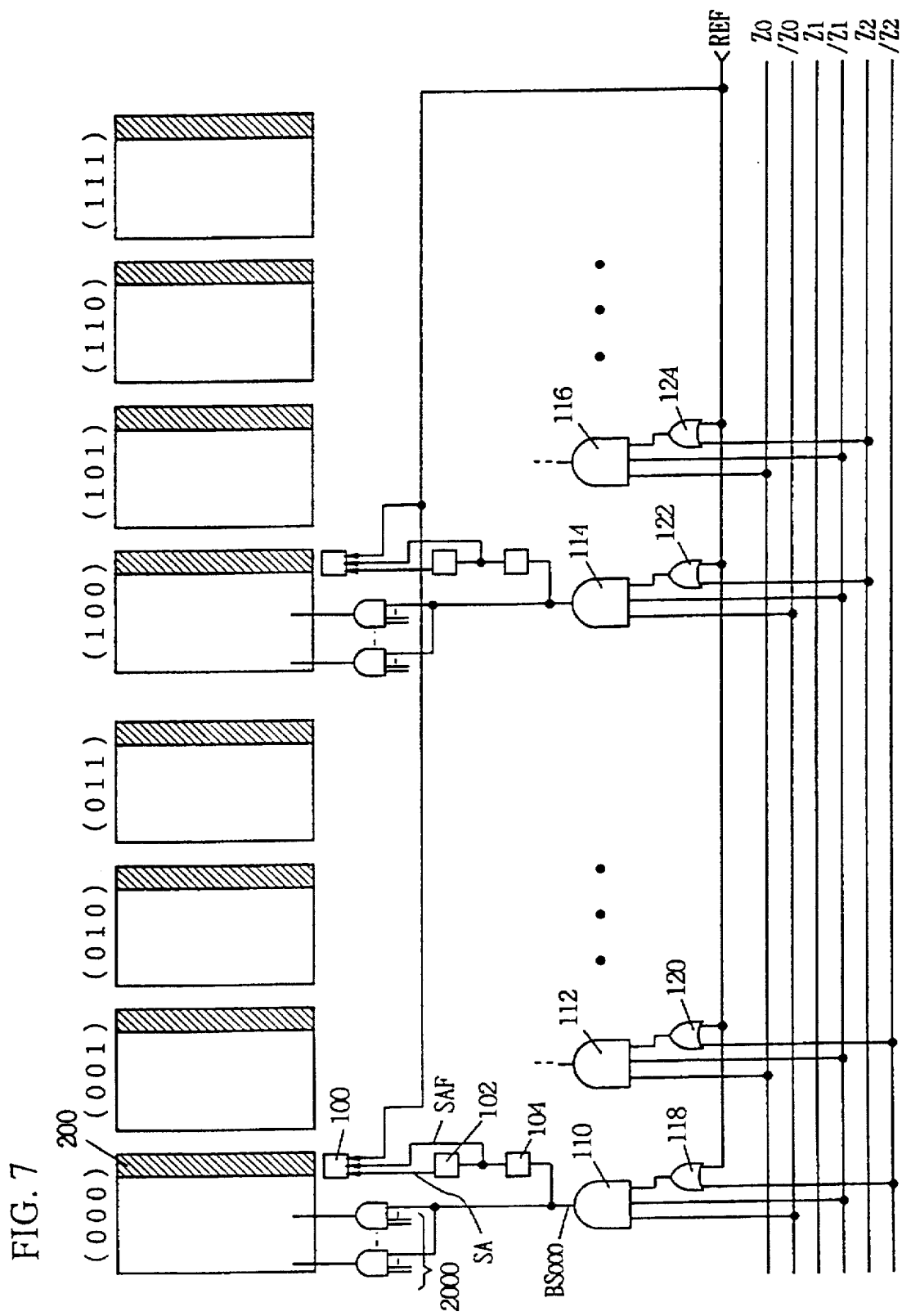
FIG. 7 is a schematic block diagram showing a structure of a semiconductor memory device in accordance with a fourth embodiment of the present invention.

FIG. 7 is a schematic diagram showing a fourth embodiment of the present invention.

In this embodiment, as in the second first embodiment shown in FIG. 1, a dynamic semiconductor memory device has its memory cell array divided into eight blocks. In normal operation, one of the blocks is selected and operated, and in the refreshing operation, two of the blocks are selected and operated, as in the prior art.

What is different is that a block selection signal $BS_{000}$ which has past through a delay circuit 104 is used as a sense amplifier activating signal SAF and the signal SAF further delayed by delay circuit 102 is used as a sense amplifier activating signal SA, which signals SAF and SF are input to sense amplifier drive circuit 100. The structure of sense amplifier drive circuit 100 is the same as that described with reference to FIG. 5. Sense amplifiers 200 in FIG. 7 include the same sense amplifiers as sense amplifier 200 of FIG. 5.

Therefore, in a block divided dynamic semiconductor memory device, sensitivity of the sense amplifier in normal operation can be improved, and at the same time, peak value of the power supply current when the sense amplifier operates can be suppressed. Further, the speed of operation is not sacrificed.

Further, in refreshing operation, driving force of the sense amplifier is further reduced than in the normal operation, and hence even when two block are operated simultaneously, the peak value of the power supply current can be suppressed. Further, as the operation proceeds in two steps, the sensitivity can be maintained while the speed of operation is not degraded.

[Fifth Embodiment]

Figure 8:
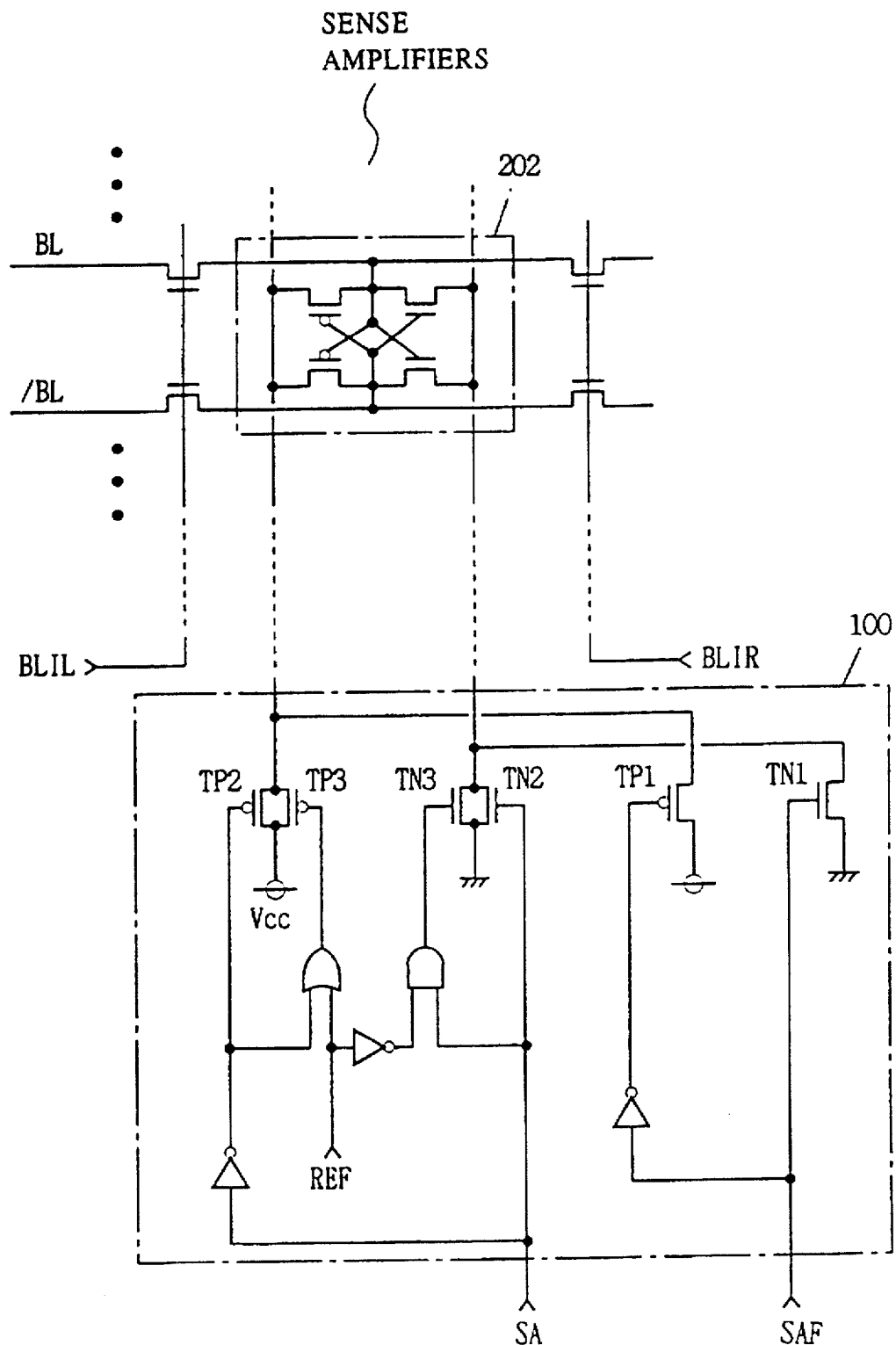
FIG. 8 is a schematic diagram showing structures of sense amplifiers and sense amplifier drive circuit in accordance with a fifth embodiment of the present invention.

FIG. 8 shows a further embodiment of the present invention. What is different from the first embodiment is that, in order to cope with the so called shared sense amplifier method, bit line pair BL and /BL connected to the input of the sense amplifier are selected by signals BLIL and BLIR.

Figure 9:
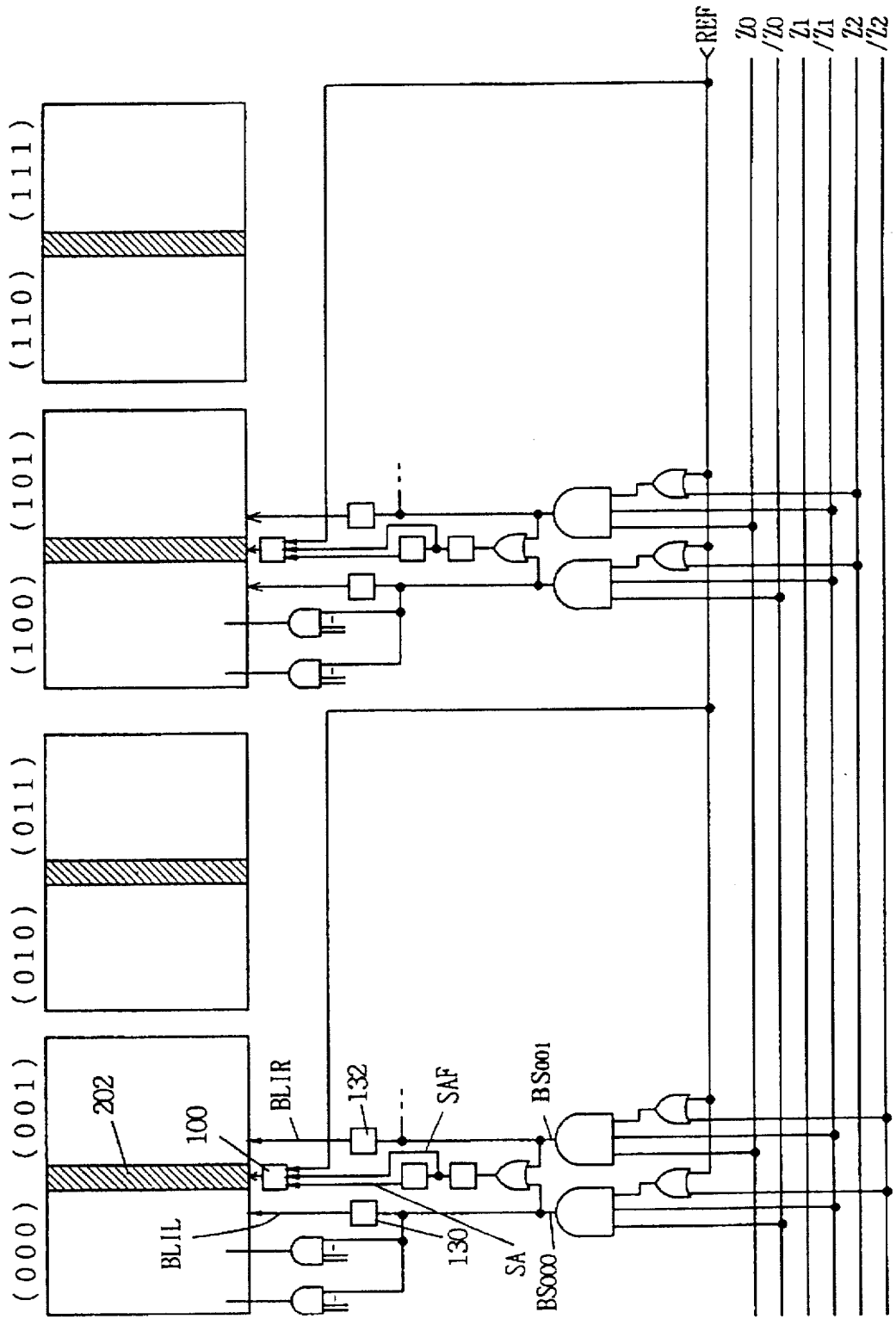
FIG. 9 is a schematic block diagram showing a structure of a semiconductor memory device in accordance with a fifth embodiment of the present invention.

FIG. 9 shows an example in which the sense amplifier 202 and sense amplifier drive circuit 100 of FIG. 8 are applied to a shared sense amplifier type dynamic semiconductor memory device in which memory cell arrays are divided into paired blocks, and a sense amplifier is provided commonly to each pair.

What is different from the fourth embodiment of FIG. 7 is that when a block (0, 0, 0) is selected, for example, block selection signal $BS_{000}$ is also input to BLI drive circuit 130, and by an output signal therefrom, the sense amplifiers 202 are electrically conducted to the memory cells in the block (0, 0, 0).

In the dynamic semiconductor memory device in accordance with this embodiment also, as in the fourth embodiment of FIG. 7, the sensitivity of the sense amplifier can be increased, the peak current value can be decreased, and in addition, since the number of sense amplifiers is reduced, chip area can be reduced.

[Sixth Embodiment]

In the third embodiment shown in FIG. 5, the low speed, high sensitivity mode operation condition in the initial stage of sense amplifier operation is common in normal operation and refreshing operation. Therefore, reduction of the driving force of the sense amplifier in the low speed, high sensitivity mode has a limit if degradation of access time in normal operation is to be prevented. In order to suppress peak current value of the power supply in refreshing operation, it is preferable that the operational condition of low speed, high sensitivity mode in normal operation and in refreshing operation can be set independent from each other.

Figure 10:
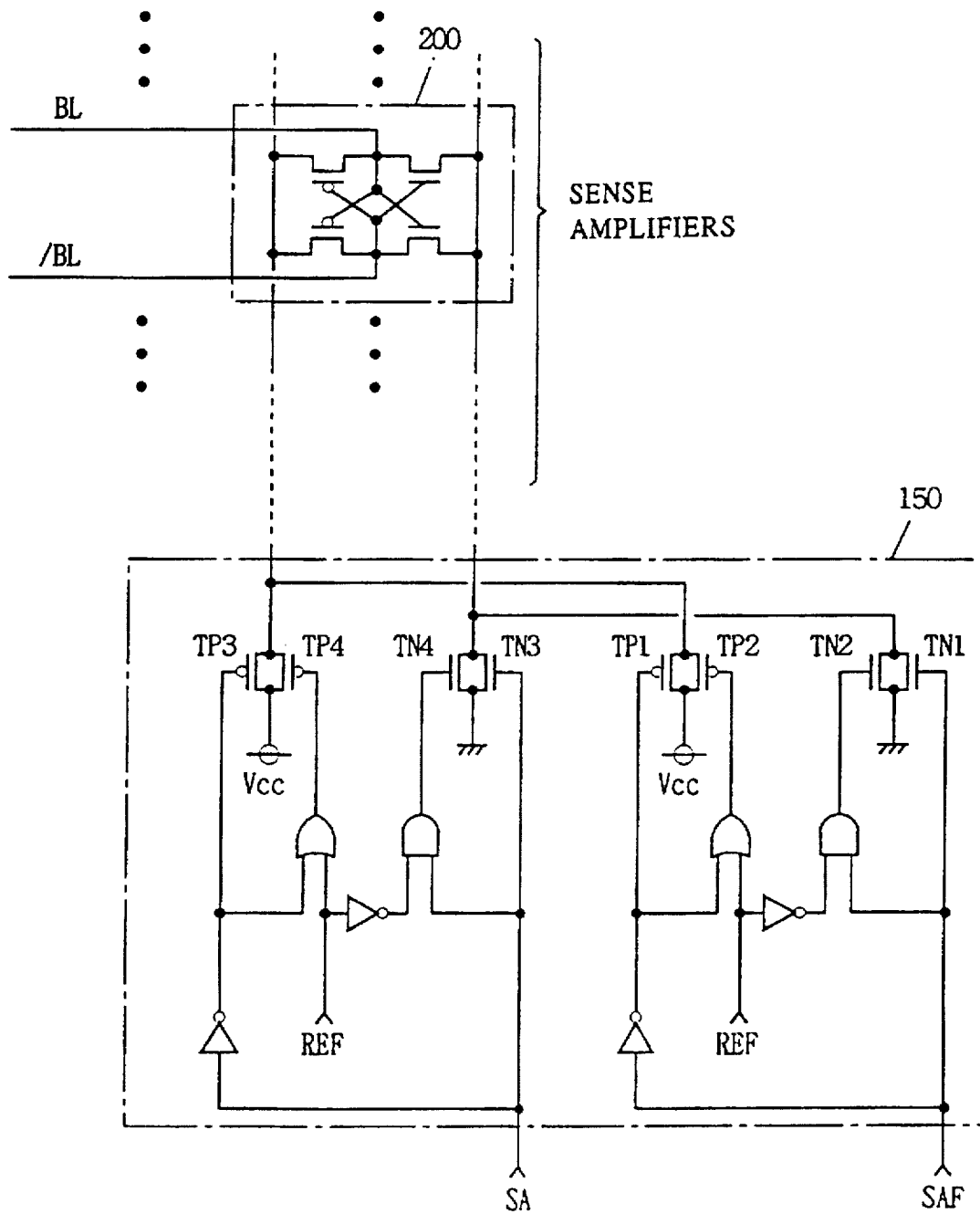
FIG. 10 is a schematic diagram showing structures of sense amplifiers and sense amplifier drive circuit in accordance with a sixth embodiment of the present invention.

The sense amplifier drive circuit 150 in accordance with the sixth embodiment of FIG. 10 shows an improvement in this point.

What is different from the first embodiment is that in the low speed, high sensitivity mode controlled by the sense amplifier activating signal SAF, the on resistance of a switch circuit coupling the sense amplifier 200 to the power supply potential and a ground potential is changed in two steps.

Namely, in normal operation, in the initial stage of operation of the sense amplifier 200, N channel MOSFETs TN1 and TN2 and P channel MOSFETs TP1 and TP2 are rendered conductive by the sense amplifier activating signal SAF. Thereafter, by sense amplifier activating signal SA, N channel MOSFETs TN3 and TN4 as well as P channel MOSFETs TP3 and TP4 are opened (rendered conductive).

Here, it is assumed that the gate width $W_{TN1}$ to $W_{TN4}$ of N channel MOSFETs TN1 to TN4 and gate widths $W_{TP1}$ to $W_{TP4}$ of P channel MOSFETs TP1 to TP4 are set to satisfy the following relations:

$$W_{TN3}+W_{TN4} \geq W_{TN1}+W_{TN2} \quad (3)$$

$$W_{TP3}+W_{TP4} \geq W_{TP1}+W_{TP2} \quad (4)$$

Under the above described condition, in the initial stage of operation, the sense amplifier is coupled to the ground potential and to the power supply potential through a relatively high resistance, and operates with high sensitivity at low speed.

Thereafter, as all the transistors are opened (rendered conductive), sense amplifier 200 is coupled to the ground potential and to the power supply potential through a low resistance, and the operation is changed to high speed, low sensitivity operation.

Meanwhile, in refreshing operation, refresh operation control signal REF attains to the "H" level, and hence P channel MOSFETs TP2 and TP4 as well as N channel MOSFETs TN2 and TN4 are all closed (non-conductive).

Therefore, the initial stage of operation of sense amplifier 200, N channel MOSFET TN1 and P channel MOSFET TP1 are opened (rendered conductive) by sense amplifier activating signal SAF.

Thereafter, by sense amplifier activating signal SA, N channel MOSFET TN3 and P channel MOSFET TP3 are opened (rendered conductive). Here, the gate width of N channel MOSFETs TN1 and TN3 and of P channel MOSFETs TP1 and TP3 are assumed to be set to satisfy the following relation:

$$W_{TN3} \geq W_{TN1} \quad (5)$$

$$W_{TP3} \geq W_{TP1} \quad (6)$$

Further, under the above described condition, as in the normal operation, sense amplifier 200 switches from high speed low sensitivity operation in the initial state to high speed, low sensitivity operation. Further, throughout the operation, the driving force in the refreshing operation is kept smaller than in the normal operation, that is, with smaller current consumption.

As described above, in the present embodiment, both in the low speed, high sensitivity operation stage and high speed, low sensitivity operation stage in normal operation and refreshing operation, the trade off between the current consumption and speed of operation can be controlled independent from each other.

Therefore, peak current value can be suppressed without decreasing the speed of operation either in the refreshing operation or the normal operation.

Further, the sensitivity of the sense amplifier 200 can be kept high.

[Seventh Embodiment]

Figure 11:
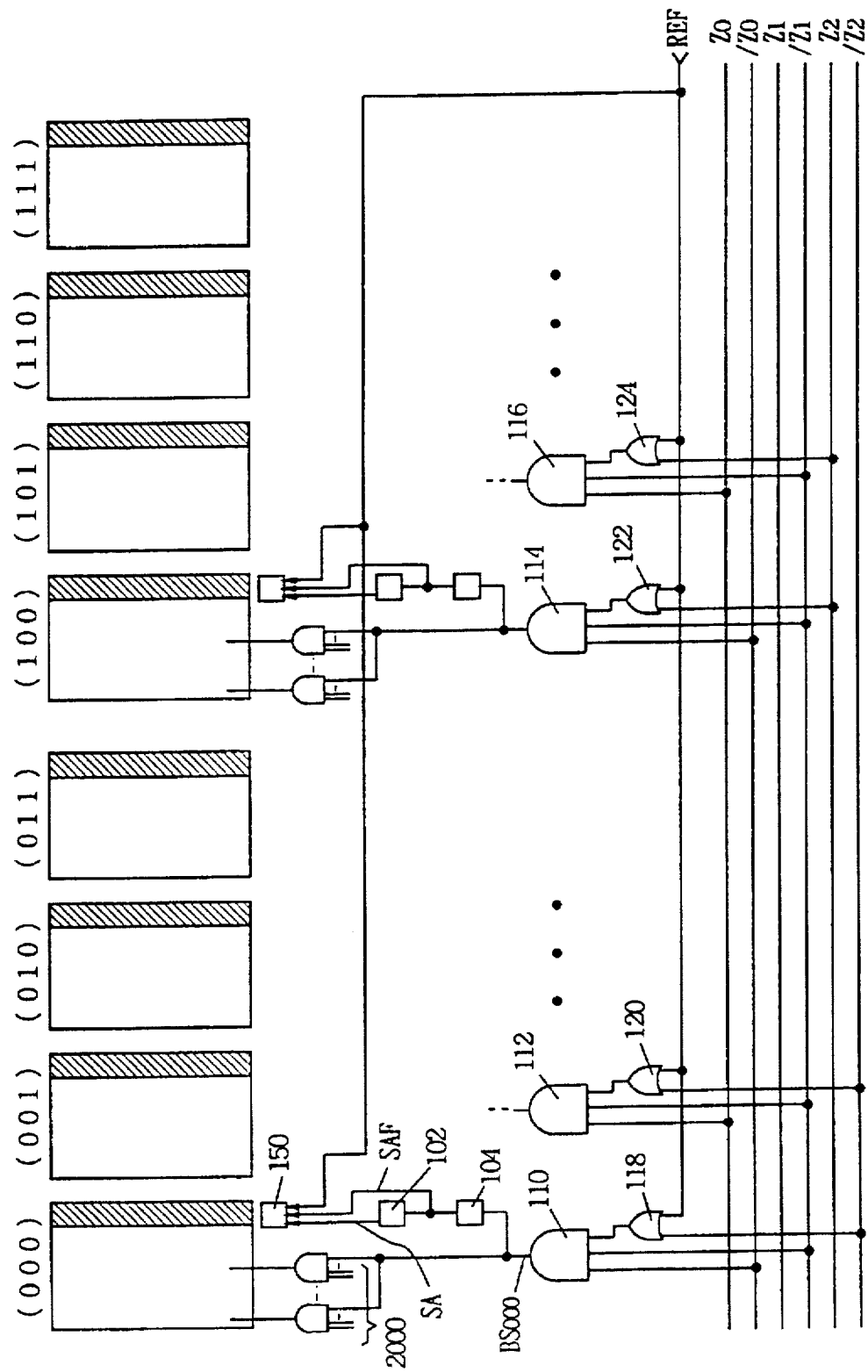
FIG. 11 is a schematic block diagram showing a structure of a semiconductor memory device in accordance with a seventh embodiment of the present invention.

FIG. 11 is a schematic block diagram showing a seventh embodiment of the present invention. This embodiment is similar to the fourth embodiment shown in FIG. 11 except that the sense amplifier drive circuit is replaced by a circuit 150 in FIG. 10.

Therefore, as compared with the fourth embodiment, the peak value of power supply current to the sense amplifier in the refreshing operation can be suppressed, the peak of the power supply current in normal operation can also be suppressed and operation with high sensitivity is also possible.

[Eighth Embodiment]

Figure 12:
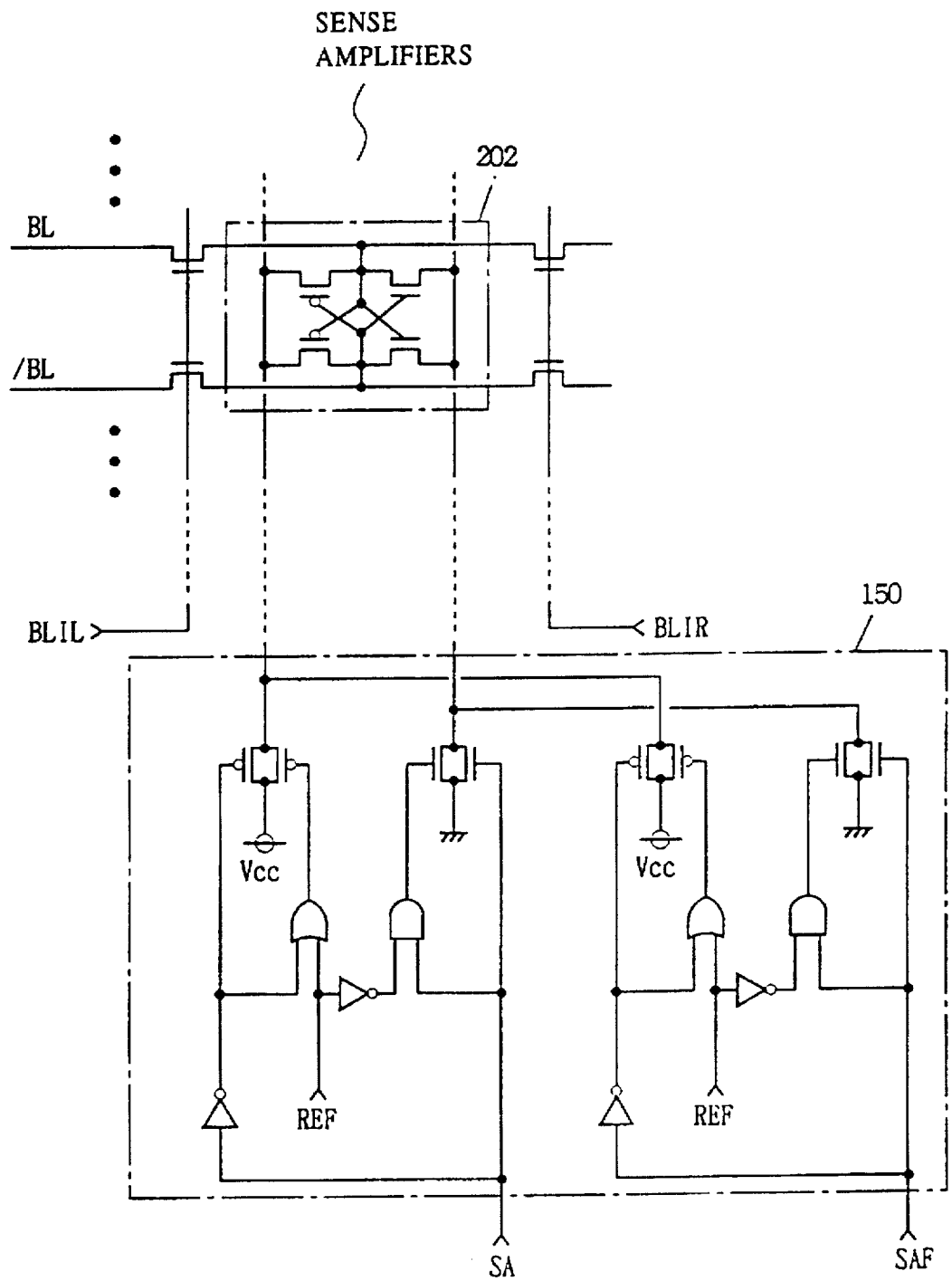
FIG. 12 is a schematic diagram showing structures of sense amplifiers and sense amplifier drive circuit in accordance with an eighth embodiment of the present invention.

FIG. 12 is a schematic diagram showing structures of sense amplifiers and sense amplifier drive circuit of an eighth embodiment of the present invention.

As in the fifth embodiment shown in FIG. 8, the bit line pair BL and /BL connected to the input of the sense amplifier are adapted to be selected by the signals BLL and BLR, so as to cope with the shared sense amplifier.

Figure 13:
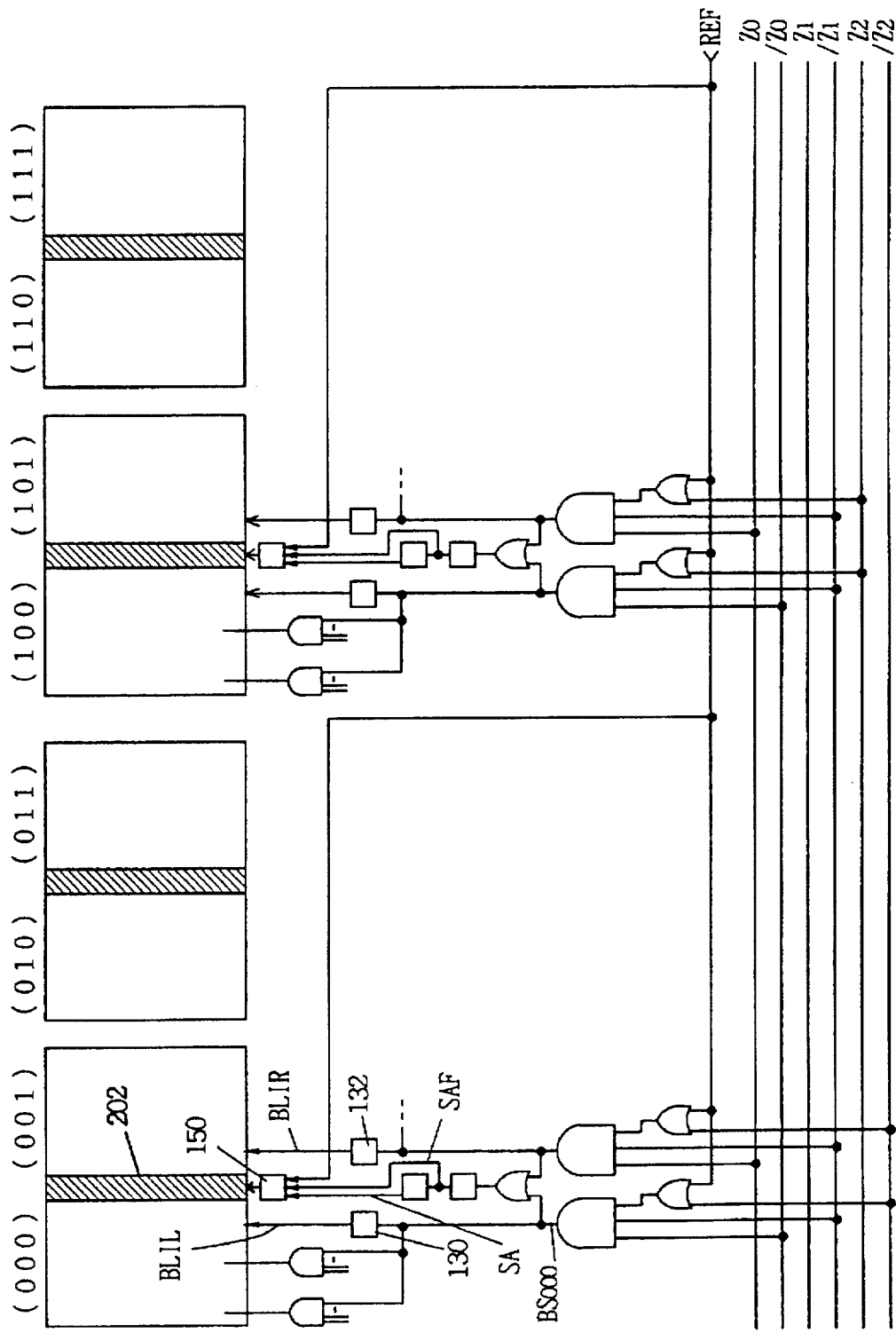
FIG. 13 is a schematic block diagram showing the structure of the semiconductor memory device in accordance with the eighth embodiment of the present invention.

FIG. 13 shows an application of the sense amplifier 202 and sense amplifier drive circuit 150 of the eighth embodiment to a shared sense amplifier type dynamic semiconductor memory device.

In the eighth embodiment also, as in the sixth embodiment, the sensitivity of the sense amplifier can be improved, peak power supply current value can be suppressed, and the number of sense amplifiers can be reduced, so that the chip area can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device, comprising:

a plurality of memory cells to which stored information is rewritten by refreshing operation;

a sense amplifier connected to said memory cell by a signal line for amplifying stored information in said memory cell;

first sense amplifier driving means controlled by a first signal, a second signal delayed by a prescribed time period from the first signal and a refresh operation control signal, for coupling/decoupling said sense amplifier to and from a first power supply potential, said first sense amplifier driving means including a first switch circuit opened/closed by said first signal, and a second switch circuit opened/closed by said second signal, said second switch circuit having its on-resistance switched to either one of a first and a second value by the refresh operation control signal; and second sense amplifier driving means controlled by the same signals as said first sense amplifier driving means for coupling/decoupling said sense amplifier to and from a second power supply potential, said second sense amplifier driving means including a third switch circuit opened/closed by said first signal, and a fourth switch circuit opened/closed by said second signal, said fourth switch circuit having its on-resistance switched to either one of a third and a fourth value by the refresh operation control signal.

2. A dynamic semiconductor memory device comprising:

a memory cell array including a plurality of memory cells to which stored information is rewritten during refreshing operation and reading/writing of information is performed during normal operation, and divided into a plurality of blocks;

means for selecting and refreshing larger number of said blocks in refreshing operation than the number of said blocks selected during normal operation;

a plurality of sense amplifiers provided corresponding to a plural columns of the memory cells of said memory cell array, each connected to the memory cells of said corresponding columns by a signal line for amplifying stored information in said memory cell;

first sense amplifier driving means provided at least one for each of said blocks, controlled by a first signal, a second signal delayed by a prescribed time period from the first signal and a refresh operation control signal for coupling/decoupling said sense amplifier to and from a first power supply potential, said first sense amplifier driving means including a first switch circuit opened/closed by said first signal, and a second switch circuit opened/closed by said second signal, said second switch circuit having its on resistance switched to either one of a first and a second value by the refresh operation control signal;

second sense amplifier driving means controlled by the same signals as said first sense amplifier driving means for coupling/decoupling said sense amplifier to and from a second power supply potential, said second sense amplifier driving means including a third switch circuit opened/closed by said first signal, and a fourth switch circuit opened/closed by said second signal, said fourth switch circuit having its on resistance switched to either one of a third and a fourth value by the refresh operation control signal.

3. The dynamic semiconductor memory device according to claim 2, wherein said first switch circuit includes a first P channel MOSFET having a first gate width, said second switch circuit includes a second P channel MOSFET having a second gate width and a third P channel MOSFET which is rendered non-conductive in accordance with the refresh operation control signal at the refreshing operation;

said third switch circuit includes a first N channel MOSFET having a third gate width; and said fourth switch circuit includes a second N channel MOSFET having a fourth gate width, and a third N channel MOSFET which is rendered non-conductive in response to the refresh operation control signal at the refreshing operation.

4. The dynamic semiconductor memory device according to claim 3, wherein said second gate width is not smaller than said first gate width, and said fourth gate width is not smaller than said third gate width.

5. A dynamic semiconductor memory device comprising:

a memory cell array including a plurality of memory cells to which stored information is rewritten during refreshing operation and reading/writing information is performed in normal operation, and divided into a plurality of paired blocks;

a plurality of sense amplifiers provided commonly corresponding to a plurality of columns of the memory cells belonging to both blocks of each pair of said memory cell blocks, each connected to the memory cells of said corresponding columns by means of signal lines, for amplifying stored information in said memory cell;

means for connecting said sense amplifiers to one selected block of said pair of blocks of said memory cells when said sense amplifiers operate;

means for selecting and refreshing larger number of said blocks in refreshing operation than the number of said blocks selected during normal operation;

first sense amplifier driving means provided at least one for each of said block pair, controlled by a first signal, a second signal delayed by a prescribed time period from the first signal and a refresh operation control signal, for coupling decoupling said sense amplifier to and from a first power supply potential, said first sense amplifier driving means including a first switch circuit opened/closed by said first signal, and a second switch circuit opened/closed by said second signal, said second switch circuit having its on resistance switched to either one of a first and a second value by the refresh operation control signal; and second sense amplifier driving means provided at least one for each of said block pair, controlled by the same signals as said first sense amplifier driving means for coupling/decoupling said sense amplifier to and from a second power supply potential, said second sense amplifier driving means including a third switch opened/closed by said first signal, and a fourth switch circuit opened/closed by said second signal, said fourth switch circuit having its on resistance switched to either one of a third and a fourth value by the refresh operation control signal.

6. A dynamic semiconductor memory device comprising:

a memory cell to which stored information is rewritten by a refresh operation;

a sense amplifier connected to said memory cell by a signal line for amplifying stored information in said memory cell;

first sense amplifier driving means controlled by a first signal, a second signal delayed by a prescribed time period from the first signal, and a refresh operation control signal, for coupling/decoupling said sense amplifier to and from a first power supply potential, said first sense amplifier driving means including a first switch circuit opened/closed by said first signal, said first switch circuit having its on-resistance switched to either one of a first and a second value by the refresh operation control signal, and a second switch circuit opened/closed by said second signal, said second switch circuit having its on-resistance switched to either one of a third and a fourth value by the refresh operation control signal; and second sense amplifier driving means controlled by the same signals as said first sense amplifier driving means for coupling/decoupling said sense amplifier to and from a second power supply potential, said second sense amplifier driving means including a third switch circuit opened/closed by said first signal, said third switch circuit having its on-resistance switched to either one of a fifth and a sixth value by a refresh operation control signal, and a fourth switch circuit opened/closed by said second signal, said fourth switch circuit having its on-resistance switched to either one of a seventh and an eighth value by the refresh operation control signal.

7. A dynamic semiconductor memory device, comprising:

a memory cell array including a plurality of memory cells to which stored information is rewritten during refreshing operation and reading/writing of information is performed during normal operation, and divided into a plurality of blocks;

means for selecting and refreshing larger number of said blocks in refreshing operation than the number of said blocks selected during normal operation;

a plurality of sense amplifiers provided corresponding to a plurality of columns of the memory cells of said memory cell array, each connected to the memory cell of said corresponding column by a signal line, for amplifying stored information in said memory cell;

first sense amplifier driving means provided at least one for each said block, controlled by a first signal, a second signal delayed by a prescribed time period and from the first signal and a refresh operation control signal, for coupling/decoupling said sense amplifier to and from a first power supply potential, said first sense amplifier driving means including a first switch circuit opened/closed by said first signal, said first switch circuit having its on resistance switched to either one of a first and a second value by the refresh operation control signal, and a second switch circuit opened/closed by said second signal, said second switch circuit having its on resistance switched to either one of a third and a fourth value by the refresh operation control signal; and second sense amplifier driving means controlled by the same signals as said first sense amplifier driving means, for coupling/decoupling said sense amplifier to and from a second power supply potential, said second sense amplifier driving means including a third switch circuit opened/closed by said first signal, said third switch circuit having its on resistance switched to a fifth or a sixth value by the refreshing operation control signal, and a fourth switch circuit opened/closed by said second signal, said fourth switch circuit having its on resistance switched to either one of a seventh and an eighth value by the refresh operation control signal.

8. The dynamic semiconductor memory device according to claim 7, wherein said first switch circuit includes a first P channel MOSFET having a first gate width, and second P channel MOSFET having a second gate width, controlled by the refresh operation control signal independent from the first signal and rendered non-conductive at the refreshing operation;

said second switch circuit includes a third P channel MOSFET having a third gate width, and a fourth P channel MOSFET having a fourth gate width, controlled by the refresh operation control signal independent from the second signal and rendered non-conductive at the refreshing operation;

said third switch circuit includes a first N channel MOSFET having a fifth gate width, and a second N channel MOSFET having a sixth gate width controlled by the refresh operation control signal independent from the first signal, and rendered non-conductive at the refreshing operation; and said fourth switch circuit includes a third N channel MOSFET having a seventh gate width, and a fourth N channel MOSFET having an eighth gate width controlled by the refresh operation control signal independent from the second signal, and rendered non-conductive at the refreshing operation.

9. The dynamic semiconductor memory device according to claim 8, wherein said third gate width is not smaller than said first gate width, sum of said third and fourth gate widths is not smaller than sum of said first and second gate widths, said seventh gate width is not smaller than said fifth gate width, and sum of said seventh and eighth gate widths is not smaller than sum of said fifth and sixth gate widths.

10. A dynamic semiconductor memory device, comprising:

a memory cell array including a plurality of memory cells to which stored information is rewritten during refreshing operation and reading/writing information is performed in normal operation, and divided into a plurality of paired blocks; a plurality of sense amplifiers provided commonly corresponding to a plurality of columns of the memory cells belonging to both blocks of each pair of said memory cell blocks, each connected to the memory cells of the corresponding columns by signal lines, for amplifying stored information in said memory cell;

means for connecting one selected block of the pair of said memory cell blocks to said sense amplifier when said sense amplifier operates;

means for selecting and refreshing larger number of said blocks in refreshing operation than the number of said blocks selected during normal operation;

first sense amplifier driving means provided at least one for each of said pairs of blocks, controlled by a first signal, a second signal delayed by a prescribed time period from the first signal and a refresh operation control signal, for coupling/decoupling said sense amplifier to and from a first power supply potential, said first sense amplifier driving means including a first switch circuit opened/closed by said first signal, said first switch circuit having its on-resistance switched to either one of a first and a second value by the refresh operation control signal, and a second switch circuit opened/closed by said second signal, said second switch circuit having its on-resistance switched to either one of a third and a fourth value by the refresh operation control signal; and second sense amplifier driving means provided at least one for each of the pairs of said blocks, controlled by the same signals as said first sense amplifier driving means, for coupling/decoupling said sense amplifier to and from a second power supply potential, said second sense amplifier driving means including a third switch circuit opened/closed of said first signal, said third switch circuit having its on-resistance switched to either one of a fifth and a sixth value by the refresh operation control signal, and a fourth switch circuit opened/closed by said second signal, said fourth switch circuit having its on-resistance switched to either one of a seventh and an eighth value by the refresh operation control signal.

11. A dynamic semiconductor memory device capable of performing a refresh operation and a normal operation, comprising:

a pair of bit lines for transmitting an information stored in a memory cell;

a sense amplifier for amplifying a potential difference between the bit lines, wherein said sense amplifier includes a first input node for receiving a first power supply potential corresponding to a potential which one of said bit lines is amplified into, and a second input node for receiving a second power supply potential corresponding to a potential which another of said bit lines is amplified into, said dynamic semiconductor memory device further comprising, first sense amplifier driving means for applying said first power supply potential to said first node in response to a sense amplifier drive signal, wherein an on-resistance of said first sense amplifier driving means is rendered lower in response to a delayed signal from said sense amplifier drive signal than that before arrival of said delayed signal in said normal operation, and said on-resistance in said refresh operation is rendered higher in response to a refresh operation control signal than that in said normal operation, second sense amplifier driving means for applying a second power supply potential to said second node in response to said sense amplifier drive signal.

12. The dynamic semiconductor memory device according to claim 11, wherein said first sense amplifier driving means includes a first switch circuit coupled between said first node and said first power supply potential, and rendered conductive in response to said sense amplifier drive signal in said normal operation; and a second switch circuit coupled between said first node and said first power supply potential, and rendered conductive in response to said delayed signal in said normal operation and said refresh operation, an on-resistance of said second switch circuit being rendered higher in response to said refresh operation control signal.

13. The dynamic semiconductor memory device according to claim 12, wherein said first power supply potential is high level potential and said second power supply potential is low level potential.

14. The dynamic semiconductor memory device according to claim 12, wherein said first power supply potential is low level potential and said second power supply potential is high level potential.

15. The dynamic semiconductor memory device according to claim 12, wherein said second switch circuit includes a first transistor coupled between said first node and said first power supply potential and rendered conductive in response to the delayed signal in said normal operation and said refresh operation; and a second transistor coupled between said first node and said first power supply potential, rendered conductive in response to said delayed signal in said normal operation and rendered non-conductive in response to said refresh operation control signal in said refresh operation.

16. The dynamic semiconductor memory device according to claim 12, wherein an on-resistance of said first switch circuit is rendered higher in response to said refresh operation control signal.

* * * * *